US012772434B2

(12) United States Patent
An et al.

(10) Patent No.: US 12,772,434 B2

(45) Date of Patent: Oct. 20, 2026

(54) SEMICONDUCTOR DEVICE

(71) Applicant: SAMSUNG ELECTRONICS CO., LTD., Suwon-si (KR)

(72) Inventors: Hyeri An, Suwon-si (KR); Dongsik Park, Suwon-si (KR); Sooho Shin, Suwon-si (KR); Joonsuk Park, Suwon-si (KR); Keonhee Park, Suwon-si (KR); Gaeun Lee, Suwon-si (KR); Jihoon Chang, Suwon-si (KR); Yujin Cho, Suwon-si (KR); Hana Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 448 days.

(21) Appl. No.: 18/478,978

(22) Filed: Sep. 29, 2023

(65) Prior Publication Data

US 2024/0196594 A1 Jun. 13, 2024

(30) Foreign Application Priority Data

Dec. 8, 2022 (KR) ........................ 10-2022-0170453

(51) Int. Cl.
*H10B 12/00* (2023.01)

(52) U.S. Cl.
CPC ........... *H10B 12/315* (2023.02); *H10B 12/01* (2023.02)

(58) Field of Classification Search
CPC ...... H10D 1/696; H10D 1/692; H10B 12/033; H10B 12/05; H10B 12/053; H10B 12/315
See application file for complete search history.

(56) References Cited

U.S. PATENT DOCUMENTS 5,895,239 A * 4/1999 Jeng ..................... H10B 12/033 257/E21.654
6,150,208 A 11/2000 Deboer et al.
(Continued)

FOREIGN PATENT DOCUMENTS

CN 107910327 4/2018
CN 113937090 A 1/2022
CN 114284270 A 4/2022

OTHER PUBLICATIONS

Extended European Search Report dated May 3, 2024, in corresponding European Patent Application No. 23212528.6, 10 pages.

*Primary Examiner* — Evren Seven
(74) *Attorney, Agent, or Firm* — Morgan, Lewis & Bockius LLP

(57) ABSTRACT

A semiconductor device includes a switching element, and a data storage structure electrically connected to the switching element. The data storage structure includes first electrodes, a second electrode, and a dielectric layer between the first electrodes and the second electrode. The second electrode includes a compound semiconductor layer doped with an impurity element, the compound semiconductor layer includes two or more elements and includes a semiconductor material doped with the impurity element, the two or more elements include a first element and a second element, the first element is silicon (Si), and a concentration of the impurity element in the compound semiconductor layer is in a range of about 0.1 at % to about 5 at %, and a concentration of the first element in the compound semiconductor layer is in a range of about 10 at % to about 15 at %.

19 Claims, 18 Drawing Sheets

(56) References Cited

U.S. PATENT DOCUMENTS

| | | | | |
|---|---|---|---|---|
| 6,368,912 | B1 * | 4/2002 | Chang | H10B 12/0383<br>438/242 |
| 8,710,624 | B2 | 4/2014 | Tonari | |
| 9,673,272 | B2 | 6/2017 | Choi et al. | |
| 11,075,204 | B2 * | 7/2021 | Kim | H10B 12/50 |
| 2002/0139973 | A1 * | 10/2002 | Nakazato | H10D 30/0411<br>257/E27.098 |
| 2003/0151083 | A1 * | 8/2003 | Matsui | C23C 16/56<br>257/306 |
| 2007/0138599 | A1 * | 6/2007 | Ahn | H10B 12/053<br>257/E21.655 |
| 2008/0029790 | A1 | 2/2008 | Ahn et al. | |
| 2011/0045650 | A1 | 2/2011 | Maekawa | |
| 2012/0064689 | A1 * | 3/2012 | Hirota | H10D 1/042<br>438/381 |
| 2017/0287914 | A1 | 10/2017 | Okada | |
| 2018/0175042 | A1 * | 6/2018 | Jang | H01L 21/321 |
| 2018/0301457 | A1 * | 10/2018 | Lee | H10B 12/0335 |
| 2020/0161307 | A1 | 5/2020 | Jang et al. | |
| 2020/0212169 | A1 | 7/2020 | Kim | |
| 2022/0344346 | A1 | 10/2022 | Lee et al. | |
| 2023/0209807 | A1 | 6/2023 | Wu et al. | |
| 2023/0262959 | A1 * | 8/2023 | Park | H10B 53/30<br>257/296 |
| 2024/0049441 | A1 * | 2/2024 | Oh | H10B 12/315 |

* cited by examiner

SEMICONDUCTOR DEVICE

CROSS-REFERENCE TO RELATED APPLICATION(S)

This application claims priority under 35 U.S.C. § 119 from Korean Patent Application No. 10-2022-0170453, filed on Dec. 8, 2022 in the Korean Intellectual Property Office, the contents of which are herein incorporated by reference in their entirety for all purposes.

TECHNICAL FIELD

Embodiments of the present disclosure are directed to a semiconductor device.

DISCUSSION OF THE RELATED ART

Semiconductor devices shipped from the production line may be delivered to the user through various means of transportation. When a semiconductor device is exported abroad, transportation means, such as ships, aircraft, or the like, may be used. In the case of aircraft, the price is high, while it IS able to transport quickly. However, when semiconductor devices are transported by aircraft, the semiconductor devices may be affected by radiation according to a route and altitude of the aircraft, and radiation may cause defects in the product.

SUMMARY

Embodiments provide a semiconductor device in which defects due to radiation that may affect the semiconductor device in the transportation process may be significantly reduced and electrical properties and reliability may be improved.

According to embodiments, a semiconductor device includes a switching element, and a data storage structure electrically connected to the switching element. The data storage structure includes a plurality of first electrodes; a second electrode; and a dielectric layer disposed between the plurality of first electrodes and the second electrode. The second electrode includes a compound semiconductor layer doped with an impurity element, the compound semiconductor layer includes two or more elements and includes a semiconductor material doped with the impurity element, the two or more elements include a first element and a second element, and the first element is silicon (Si). A concentration of the impurity element in the compound semiconductor layer is in a range of about 0.1 at % to about 5 at %, and a concentration of the first element in the compound semiconductor layer is in a range of about 10 at % to about 15 at %.

According to embodiments, a semiconductor device includes a transistor that includes a first source/drain region and a second source/drain region that are spaced apart from each other, a channel region interposed between the first and second source/drain regions, a gate dielectric layer in contact with the channel region, and a gate electrode disposed on the gate dielectric layer; a bit line electrically connected to the first source/drain region; and a data storage structure that is electrically connected to the second source/drain region. The data storage structure includes a first electrode electrically connected to the second source/drain region; a second electrode; and a dielectric layer disposed between the first electrode and the second electrode. The second electrode includes a compound semiconductor layer doped with boron (B) and a conductive layer disposed on the compound semiconductor layer. The compound semiconductor layer includes two or more elements, the two or more elements include silicon (Si) and germanium (Ge), and a concentration of the boron (B) in the compound semiconductor layer is within a range of about 0.1 at % to about 5 at %, and a concentration of the silicon (Si) in the compound semiconductor layer is within a range of about 10 at % to about 15 at %.

According to embodiments, a semiconductor device includes a device isolation layer that defines active regions on a substrate; gate electrodes that cross the active regions and extend into the device isolation layer; first impurity regions and second impurity regions formed in the active regions on both sides of the gate electrodes; bit lines disposed on the gate electrodes and electrically connected to the first impurity regions; upper conductive patterns disposed on side surfaces of the bit lines and electrically connected to the second impurity regions; first electrodes that vertically extend on the upper conductive patterns and are connected to the upper conductive patterns, where the first electrodes are horizontally spaced apart from each other; at least one supporter layer disposed between horizontally adjacent first electrodes and in contact with the first electrodes; a dielectric layer disposed on the first electrodes and the at least one supporter layer; and a second electrode disposed on the dielectric layer. The second electrode includes a compound semiconductor layer doped with an impurity element and a conductive layer disposed on the compound semiconductor layer. The compound semiconductor layer includes two or more elements and includes a semiconductor material doped with the impurity element. The two or more elements include a first element and a second element, and a concentration of the Impurity element in the compound semiconductor layer is in a range of about 0.1 at % to about 5 at %, and a concentration of the first element in the compound semiconductor layer is in a range of about 10 at % to about 15 at %.

DETAILED DESCRIPTION

Hereinafter, illustrative embodiments of the present disclosure will be described with reference to the accompanying drawings.

Figure 1:
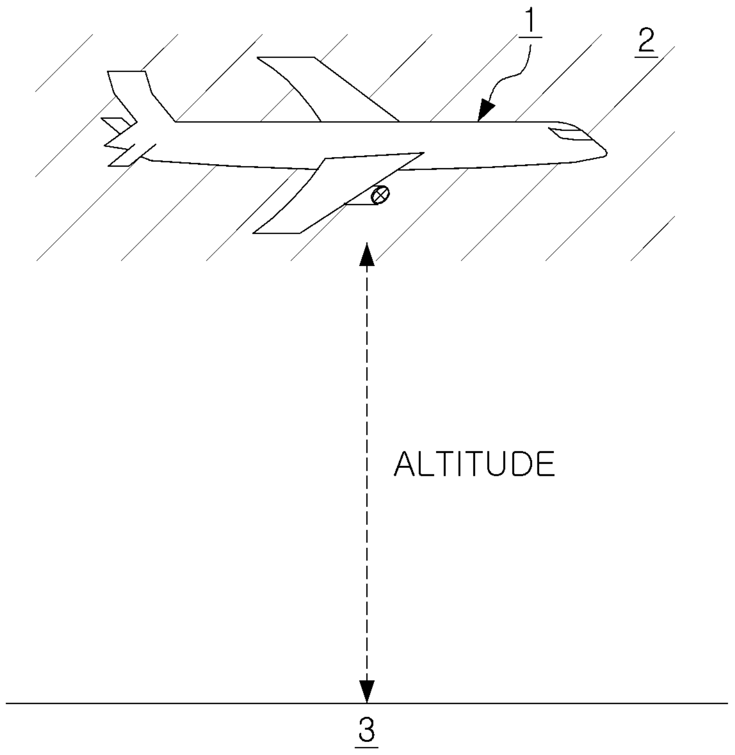
FIG. 1 illustrates a method of transporting a semiconductor device according to an embodiment of the present disclosure.

FIG. 1 illustrates a method of transporting a semiconductor device according to an embodiment of the present disclosure.

According to an embodiment illustrated in FIG. 1, semiconductor devices produced and shipped from a production line are transported by an aircraft 1. The aircraft 1 has been selected as a means of transportation for exporting semiconductor devices abroad, and can quickly transport semiconductor devices, although it is expensive compared to means of sea transportation.

The aircraft 1 flies at a predetermined altitude from a ground 3, and therefore may be affected by radiation 2 as compared to land transportation means and sea transportation means. The amount of radiation 2 to which the aircraft 1 is exposed depends on the latitude and longitude of the route along which the aircraft 1 moves, the altitude of the aircraft 1, etc.

Thermal neutrons, fast neutrons, etc., are generated by radiation, and at least a portion of the materials included in the semiconductor device transported by the aircraft 1 may absorb neutrons, causing nuclear fission. Particles may be generated as a result of nuclear fission. The generated particles move within the semiconductor device and may collide with silicon in the semiconductor device and cause damage, and vacancy defects, etc., can occur due to the damage. Due to the vacancy defects, characteristics of the semiconductor device, such as the resistance, can change, and as a result, defects can occur in the semiconductor device, hereinafter referred to as a "flight defect".

According to an embodiment, the occurrence of defects in a semiconductor device can be significantly reduced by adjusting the composition of an upper electrode.

Figure 2:
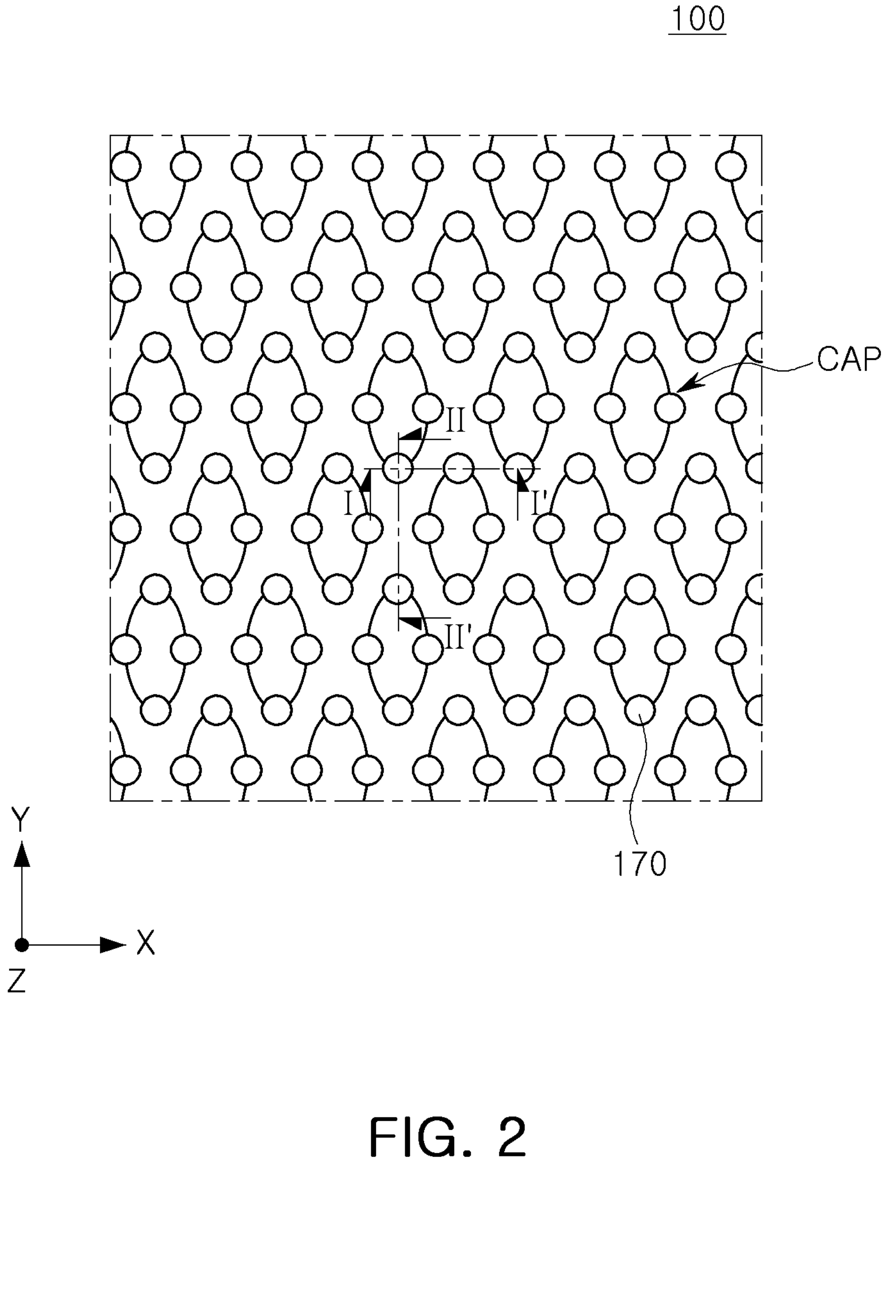
FIG. 2 is a plan view of a semiconductor device according to embodiments of the present disclosure.

FIG. 2 is a schematic plan view of a semiconductor device according to embodiments of the present disclosure.

Figure 3:
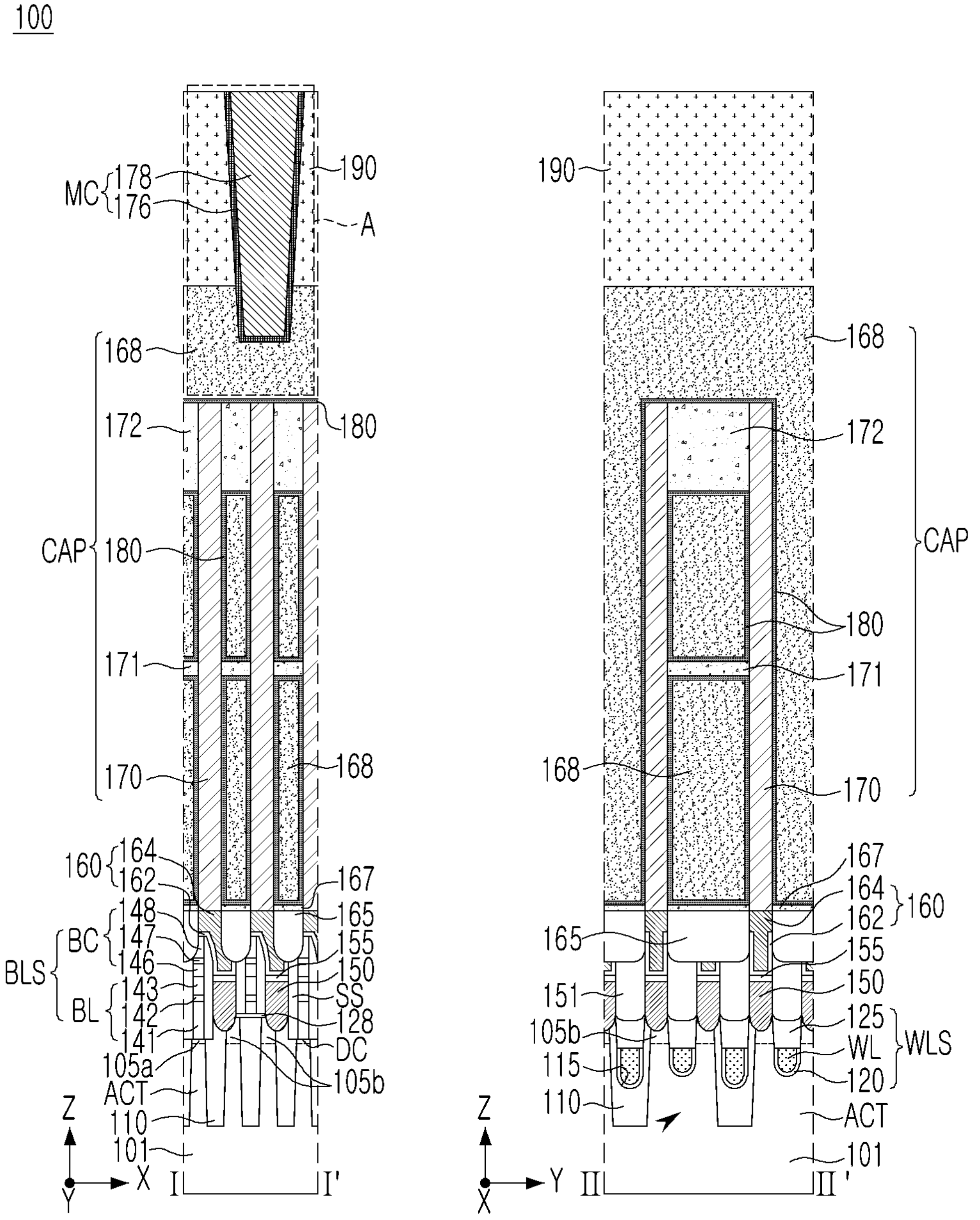
FIG. 3 is a schematic cross-sectional view of a semiconductor device according to embodiments of the present disclosure.

FIG. 3 is a schematic cross-sectional view of a semiconductor device according to embodiments of the present disclosure. FIG. 3 illustrates cross-sections of the semiconductor device taken along cutting lines I-I' and II-II' in FIG. 2.

Figure 4:
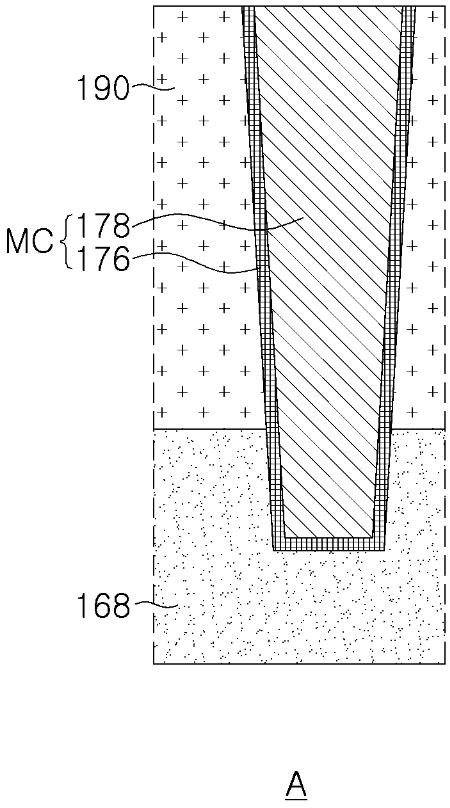
FIG. 4 is a partial enlarged cross-sectional view of a semiconductor device according to embodiments of the present disclosure.

FIG. 4 is a partial enlarged cross-sectional view of a semiconductor device according to embodiments of the present disclosure. FIG. 4 is an enlarged view of region" " of FIG. 3.

Referring to FIGS. 2 to 4, in an embodiment, a semiconductor device 100 includes a substrate 101 that includes active regions ACT, a device isolation layer 110 that defines the active regions ACT in the substrate 101, a word line structure (WLS) buried and extending in the substrate 101 and that includes a word line (WL), a bit line structure (BLS) disposed on the substrate 101 and that extends across the word line structure (WLS) and includes a bit line (BL), and a capacitor structure (CAP) disposed on the bit line structure (BLS). The semiconductor device 100 further includes a lower conductive pattern 150 disposed on the active region ACT, an upper conductive pattern 160 disposed on the lower conductive pattern 150, and an insulating pattern 165 that penetrates through the upper conductive pattern 160.

The semiconductor device 100 may be, for example, a dynamic random access memory (DRAM) cell array. For example, the bit line BL is connected to a first impurity region 105*a* of the active region ACT, and a second impurity region 105*b* of the active region ACT is electrically connected to the capacitor structure CAP through the lower and upper conductive patterns 150 and 160. The capacitor structure CAP includes lower electrodes 170, a dielectric layer 180 disposed on the lower electrodes 170, and an upper electrode 168 disposed on the dielectric layer 180. The capacitor structure CAP further includes an etch stop layer 167 and supporter layers 171 and 172. In this specification, the "first electrodes 170" and a "second electrode 168" may be referred to as the "lower electrodes 170" and the "upper electrode 168", respectively. In addition, the "capacitor structure CAP" may be referred to as a "data storage structure".

The semiconductor device 100 includes a cell array area in which a cell array is disposed, and a peripheral circuit area in which peripheral circuits are disposed that drive memory cells disposed in the cell array. The peripheral circuit area is disposed around the cell array area.

The memory cells include a switching element and a capacitor structure (CAP). The switching element is implemented as a transistor, the gate of the transistor is connected to the word line WL, and a source/drain of the transistor is connected to the bit line BL and the capacitor structure CAP.

For example, during air transportation of the semiconductor device 100, defects due to radiation can occur in memory cells. Vacancy defects, etc., can occur while particles generated by radiation move inside the memory cells, and as a result, electrical characteristics of the memory cells, such as resistance, can change.

The substrate 101 includes a semiconductor material, such as at least one of a Group IV semiconductor, a Group III-V compound semiconductor, or a Group II-VI compound semiconductor. For example, the group IV semiconductor includes one of silicon, germanium, or silicon-germanium. The substrate 101 may further include impurities. The substrate 101 is one of a silicon substrate, a silicon on insulator (SOI) substrate, a germanium substrate, a germanium on insulator (GOI) substrate, a silicon-germanium substrate, or a substrate that includes an epitaxial layer.

The active regions ACT in the substrate 101 are separated by the device isolation layer 110. The active region ACT may have a bar shape and may be disposed in an island shape that extends in one direction within the substrate 101. The one direction is inclined with respect to an extension direction of the word lines WL and bit lines BL. The active regions ACT extend parallel to each other, but an end of an active region ACT is located adjacent to the center of an adjacent active region ACT.

The active region ACT has first and second impurity regions 105*a* and 105*b* located at a predetermined depth from the upper surface of the substrate 101. The first and second impurity regions 105*a* and 105*b* are spaced apart from each other. The first and second impurity regions 105*a* and 105*b* are source/drain regions of a transistor formed by the word line WL. The first and second impurity regions 105*a* and 105*b* are formed by doping or ion implantation of substantially the same impurities, and may be referred to interchangeably depending on the circuit configuration of the finally formed transistor. The impurities include dopants that have a conductivity type opposite to that of the substrate 101. In embodiments, the depths of the first and second impurity regions 105*a* and 105*b* in the source region and the drain region differ from each other.

The device isolation layer 110 is formed by a shallow trench isolation (STI) process. The device isolation layer 110 electrically separates the active regions ACT from each other while surrounding the same. The device isolation layer 110 is formed of an insulating material, such as silicon oxide, silicon nitride, or combinations thereof. The device isolation layer 110 includes a plurality of regions that have different lower depths depending on the width of the trench in which the substrate 101 is etched.

The word line structures WLS are disposed in gate trenches 115 that extend within the substrate 101. Each of the word line structures WLS includes a gate dielectric layer 120, the word line WL, and a gate capping layer 125. In this specification, "a structure that includes the gate dielectric layer 120 and the word line (WL) may be referred to as a "gate 120", the word line WL may be referred to as a "gate electrode", and the word line structure (WLS) may be referred to as a "gate structure".

The word line WL extends in a first (X) direction across the active region ACT. For example, a pair of adjacent word lines WL cross one active region ACT. In an embodiment, the word line WL is a gate of a buried channel array transistor (BOAT), but embodiments of the present disclosure are not necessarily limited thereto. The word line WL is disposed in a lower portion of the gate trench 115 at a predetermined thickness. The upper surface of the word line WL is located at a level lower than the upper surface of the substrate 101. In this specification, the terms 'high level' and 'low level' are defined based on a substantially flat upper surface of the substrate 101.

The word line WL includes a conductive material, such as at least one of polycrystalline silicon (Si), titanium (Ti), titanium nitride (TiN), tantalum (Ta), tantalum nitride (TaN), tungsten (W), tungsten nitride (WN), or aluminum (Al). For example, the word line WL includes a lower pattern and an upper pattern formed of different materials. The lower pattern includes at least one of tungsten (W), titanium (Ti), tantalum (Ta), tungsten nitride (WN), titanium nitride (TiN), or tantalum nitride (TaN), and the upper pattern is a semiconductor pattern that includes polysilicon doped with P-type or N-type impurities.

The gate dielectric layer 120 is disposed on the bottom surface and inner side surfaces of the gate trench 115. The gate dielectric layer 120 conformally covers inner sidewalls of the gate trench 115. The gate dielectric layer 120 includes at least one of silicon oxide, silicon nitride, or silicon oxynitride. The gate dielectric layer 120 may be, for example, a silicon oxide layer or an insulating layer that has a high dielectric constant. In embodiments, the gate dielectric layer 120 is formed by oxidizing the active region ACT or by depositing a layer.

The gate capping layer 125 fills the gate trench 115 on the word line WL. An upper surface of the gate capping layer 125 is located at substantially the same level as an upper surface of the substrate 101. The gate capping layer 125 is formed of an insulating material, such as silicon nitride.

The bit line structure BLS extends in a direction perpendicular to the word line WL, such as in a second (Y) direction. The bit line structure BLS includes the bit line BL and a bit line capping pattern BC disposed on the bit line BL.

The bit line BL includes a first conductive pattern 141, a second conductive pattern 142, and a third conductive pattern 143 that are sequentially stacked. The bit line capping pattern BC is disposed on the third conductive pattern 143. A buffer insulating layer 128 is disposed between the first conductive pattern 141 and the substrate 101, and a portion of the first conductive pattern 141, hereinafter referred to as a bit line contact pattern DC, contacts the first impurity region 105*a* of the active region ACT. The bit line BL is electrically connected to the first impurity region 105*a* through the bit line contact pattern DC. The lower surface of the bit line contact pattern DC is located at a lower level than the upper surface of the substrate 101 and is located at a higher level than the upper surface of the word line WL. In an embodiment, the bit line contact pattern DC is disposed in a bit line contact hole formed in the substrate 101 and that exposes the first impurity region 105*a*.

The first conductive pattern 141 includes a semiconductor material such as polycrystalline silicon. The first conductive pattern 141 directly contacts the first impurity region 105*a*. The second conductive pattern 142 includes a metal-semiconductor compound. The metal-semiconductor compound is, for example, a layer in which a portion of the first conductive pattern 141 is silicidated. For example, the metal-semiconductor compound is at least one of cobalt silicide (CoSi), titanium silicide (TiSi), nickel silicide (NiSi), tungsten silicide (wSi), or another metal silicide. The third conductive pattern 143 includes a metal such as titanium (Ti), tantalum (Ta), tungsten (W), or aluminum (Al). The number of conductive patterns that constitute the bit line BL, the type of material, and/or the stacking order can vary according to embodiments.

The bit line capping pattern BC includes a first capping pattern 146, a second capping pattern 147, and a third capping pattern 148 that are sequentially stacked on the third conductive pattern 143. Each of the first to third capping patterns 146, 147, and 148 includes an insulating material, such as a silicon nitride layer. The first to third capping patterns 146, 147, and 148 may be formed of different materials, and even if the same material is included, a boundary therebetween is distinguished by differences in physical properties. A thickness of the second capping pattern 147 is less than a thickness of the first capping pattern 146 and a thickness of the third capping pattern 148, respectively. The number of capping patterns that constitute the bit line capping pattern BC and/or the type of material can vary according to embodiments. In some embodiments, a fourth capping pattern is formed on the first capping pattern 146 or the third capping pattern 148.

Spacer structures SS are disposed on both sidewalls of each bit line structure BLS and extend in a direction, such as the Y direction. The spacer structures SS are disposed between the bit line structure BLS and the lower conductive pattern 150. The spacer structures SS extend along sidewalls of the bit line BL and sidewalls of the bit line capping pattern BC. A pair of spacer structures SS disposed on both sides of one bit line structure BLS have an asymmetrical shape with respect to the bit line structure BLS. Each of the spacer structures SS includes a plurality of spacer layers, and in some embodiments further include an air spacer.

The lower conductive pattern 150 is connected to one region of the active region ACT, such as the second impurity region 105*b*. The lower conductive pattern 150 is disposed between the bit lines BL and between the word lines WL. The lower conductive pattern 150 pass through the buffer insulating layer 128 and is connected to the second impurity region 105*b* of the active region ACT. The lower conductive pattern 150 directly contacts the second impurity region 105*b*. The lower surface of the lower conductive pattern 150 are located at a level lower than the upper surface of the substrate 101, and are located at a level higher than the lower surface of the bit line contact pattern DC. The lower conductive pattern 150 is insulated from the bit line contact pattern DC by the spacer structure SS. The lower conductive pattern 150 is formed of a conductive material, and, for example, includes at least one of polycrystalline silicon (Si), titanium (Ti), titanium nitride (TiN), tantalum (Ta), tantalum nitride (TaN), tungsten (W), tungsten nitride (WN), or aluminum (Al). In an embodiment, the lower conductive pattern 150 includes a plurality of layers.

A metal-semiconductor compound layer 155 is disposed between the lower conductive pattern 150 and the upper conductive pattern 160. When the lower conductive pattern 150 includes a semiconductor material, the metal-semiconductor compound layer 155 is formed from a portion of the lower conductive pattern 150 that is silicided. The metal-semiconductor compound layer 155 includes, for example, at least one of cobalt silicide (CoSi), titanium silicide (TiSi), nickel silicide (NiSi), tungsten silicide (wSi), or another metal silicide. According to some embodiments, the metal-semiconductor compound layer 155 is omitted.

The upper conductive pattern 160 is disposed on the lower conductive pattern 150. The upper conductive pattern 160 extends between the spacer structures SS and covers the upper surface of the metal-semiconductor compound layer 155. The upper conductive pattern 160 includes an upper barrier layer 162 and an upper conductive layer 164. The upper barrier layer 162 covers the lower surface and side surfaces of the upper conductive layer 164. The upper barrier layer 162 includes a metal nitride, such as at least one of titanium nitride (TiN), tantalum nitride (TaN), or tungsten nitride (WN). The conductive layer 164 includes a conductive material, such as at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), or tungsten nitride (WN).

Fence insulation patterns 151 are disposed on side surfaces of the upper conductive pattern 160 and the lower conductive pattern 150. The fence insulation patterns 151 are spaced apart from each other in the Y direction between the bit line structures BLS. The fence insulation patterns 151 vertically overlap the word line structures WLS. The fence insulation patterns 151 are disposed between the bit line structures BLS in the X direction and between the upper conductive patterns 160 in the Y direction, when viewed in a plan view.

The insulating patterns 165 pass through the upper conductive pattern 160. The upper conductive pattern 160 is divided into a plurality of conductive patterns by the insulating patterns 165. The insulating patterns 165 include an insulating material, such as at least one of silicon oxide, silicon nitride, or silicon oxynitride.

The etch stop layer 167 covers the insulating patterns 165 between the lower electrodes 170. The etch stop layer 167 contacts lower regions of side surfaces of the lower electrodes 170. The etch stop layer 167 is located lower than the support layers 171 and 172. A portion of an upper surface of the etch stop layer 167 directly contacts the dielectric layer 180. The etch stop layer 167 includes, for example, at least one of silicon nitride or silicon oxynitride.

The lower electrodes 170 are disposed on the upper conductive patterns 160. The lower electrodes 170 vertically extend from the upper conductive patterns 160 and are horizontally spaced apart from each other. The lower electrodes 170 pass through the etch stop layer 167 and contact the upper conductive patterns 160. The lower electrodes 170 have one of a cylindrical shape, a hollow cylindrical shape or a cup shape. One or more supporter layers 171 and 172 that support the lower electrodes 170 are provided between horizontally adjacent lower electrodes 170. For example, a first supporter layer 171 and a second supporter layer 172 that contact the lower electrodes 170 are disposed between horizontally adjacent lower electrodes 170. The lower electrodes 170 each include at least one of polycrystalline silicon (Si), titanium (Ti), titanium nitride (TiN), tantalum (Ta), tantalum nitride (TaN), tungsten (W), tungsten nitride (WN), or aluminum (Al).

The supporter layers 171 and 172 include a first supporter layer 171 and a second supporter layer 172 disposed on the first supporter layer 171. the first supporter layer 171 and the second supporter layer 172 are separated in a third (Z) direction by the upper electrode 168. The supporter layers 171 and 172 contact the lower electrodes 170 and extend in a direction parallel to the upper surface of the substrate 101. The second supporter layer 172 has a greater thickness than the first supporter layer 171, but is not necessarily limited thereto. The supporter layers 171 and 172 have a high aspect ratio. Each of the supporter layers 171 and 172 includes at least one of, for example, silicon nitride or silicon oxynitride, or a material similar thereto. The number, thickness, and/or arrangement relationship of the supporter layers 171 and 172 are not necessarily limited to those illustrated and may vary according to embodiments.

A dielectric layer 180 covers the etch stop layer 167, the lower electrodes 170, and the support layers 171 and 172. The dielectric layer 180 conformally covers the upper and side surfaces of the lower electrodes 170, the upper surface of the etch stop layer 167, and the exposed surfaces of the support layers 171 and 172. The dielectric layer 180 extends between the upper electrode 168 and the support layers 171 and 172. According to embodiments, respective upper and lower surfaces of the supporter layers 171 and 172 contact the dielectric layer 180. The dielectric layer 180 extends between the upper electrode 168 and the etch stop layer 167. According to embodiments, an upper surface of the etch stop layer 167 contacts the dielectric layer 180. The dielectric layer 180 includes at least one of a high-k material, silicon oxide, silicon nitride, silicon oxynitride, or combinations thereof. However, according to some embodiments, the dielectric layer 180 further includes oxides, nitrides, silicides, oxynitrides or silicified oxynitrides that include at least one of hafnium (Hf), aluminum (Al), zirconium (Zr), silicon (Si), niobium (Nb), titanium (Ti), or lanthanum (La).

The upper electrode 168 is disposed on the dielectric layer 180. The upper electrode 168 extends along the surface of dielectric layer 180. The upper electrode 168 is disposed on the lower electrodes 170 and the first and second supporter layers 171, 172. The upper electrode 168 covers the dielectric layer 180 between the lower electrodes 170 and fills a space between the lower electrodes 170. The upper electrode 168 includes at least one of polycrystalline silicon (Si), titanium (Ti), titanium nitride (TiN), tantalum (Ta), tantalum nitride (TaN), tungsten (W), tungsten nitride (WN), or aluminum (Al). The upper electrode 168 further includes a conductive material such as one of a doped semiconductor material, a conductive metal nitride, a metal, a conductive metal oxide, conductive carbon, or combinations thereof.

According to an embodiment, the upper electrode 168 includes a compound semiconductor layer doped with an impurity element. The impurity element is boron (B). The compound semiconductor layer is composed of two or more elements and includes a semiconductor material doped with the impurity element. The two or more elements include a first element and a second element. The first element is silicon (Si), and the second element is germanium (Ge). For example, the upper electrode 168 includes silicon germanium (SiGe) doped with a Group III element, and includes a compound semiconductor layer doped with boron (B), such as SiGe:B. According to an embodiment, the compound semiconductor layer doped with an impurity element has a P-type conductivity.

During transportation of the semiconductor device 100, etc., radiation is present in the surroundings, and as a result, neutrons (Nu) can enter the semiconductor device 100. The neutrons (Nu) incident on the semiconductor device 100 can be absorbed by a material in the semiconductor device 100 that has a relatively high neutron absorption rate, such as boron (B)-10, etc., to cause a nuclear fission reaction (RA). For example, a nuclear fission reaction (RA) occurs in the silicon germanium of the upper electrode 168 of the capacitor structure (CAP), and as a result, predetermined particles can be generated. In addition, a nuclear fission reaction (RA) can occur in the substrate 101, which includes a semiconductor material, and particles can be generated as a result of the nuclear fission reaction (RA). Particles produced by the nuclear fission reaction (RA) collide with nuclei of semiconductor materials, such as silicon and silicon germanium, causing damage.

To prevent the above situation, the concentration of the impurity element, such as boron (B), can be adjusted.

The concentration of the impurity element is in the range of about 0.1 at % to about 5 at %. For example, the concentration of the impurity element is in the range of about 1 at % to about 4 at %, or in the range of about 1.5 at % to about 3.6 at %. In an embodiment, the impurity element concentration was measured to be about 2.3 at %. If the concentration of the impurity element is less than about 0.1 at %, the flight defect can be reduced, but in an FAB process (FABrication) in which a semiconductor chip is produced by inscribing a semiconductor circuit on a wafer, the resistance to the etching process weakens, thereby increasing defects of semiconductor devices. If the concentration of the impurity element is greater than about 5 at %, neutrons generated due to radiation exposure during transportation of the semiconductor device 100 can cause nuclear fission of the boron (B)-10, etc., and defects of semiconductor devices can increase.

In the FAB process (FABrication), the concentration of the first element, such as silicon (Si), can be adjusted to increase resistance to the etching process. The concentration of silicon (Si) is higher than the concentration of the impurity element. The concentration of the first element is in the range of about 10 at % to about 15 at %, or in the range of about 10 at % to about 13 at %, or in the range of about 10.4 at % to about 12.5 at %. In an embodiment, the concentration of the first element was measured to be about 11.4 at %. If the concentration of the first element is less than about 10 at %, the resistance to the etching process in the FAB process (FABrication) cannot be increased, and defects of the semiconductor device can increase. If the concentration of the first element is greater than about 15 at %, resistance to the etching process in the FAB process (FABrication) is increased by silicon (Si), but since the resistance of the upper electrode 168 increases, performance of the semiconductor device can be degraded.

A contact structure MC is connected to the upper electrode 168. The contact structure MC has a pillar structure. The contact structure MC has inclined side surfaces that become narrower from top to bottom. The contact structure MC includes a barrier layer 176 and a conductive layer 178 on the barrier layer 176. The barrier layer 176 surrounds the lower surface and side surfaces of the conductive layer 178. The barrier layer 176 includes a metal and/or a metal nitride such as at least one of titanium (Ti), titanium nitride (TiN), tantalum (Ta), tantalum nitride (TaN), or tungsten nitride (WN). The conductive layer 178 includes a conductive material, such as at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), or tungsten nitride (WN). The contact structure MC is connected to a wiring layer. The contact structure MC passes through an upper insulating layer 190 that is disposed on the upper electrode 168.

FIGS. 5 to 8 are partially enlarged cross-sectional views of a semiconductor device according to embodiments of the present disclosure. FIGS. 5 to 8 illustrate an area that corresponds to the" " area in FIG. 3.

Hereinafter, the above description of the upper electrode 168 applies and will not be repeated.

Figure 5:
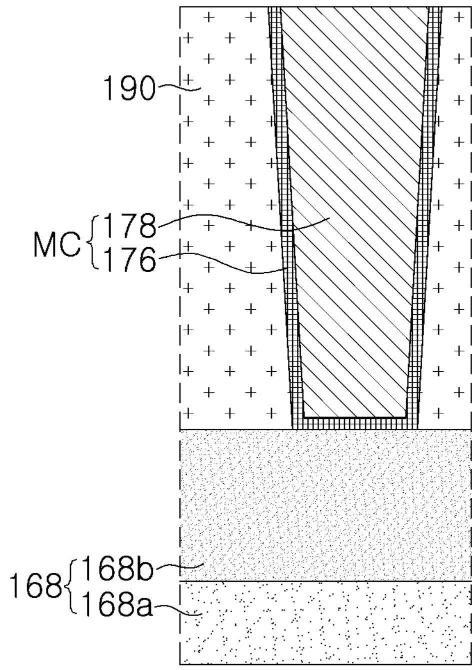
FIG. 5 is a partially enlarged cross-sectional view of a semiconductor device according to embodiments of the present disclosure.

Referring to FIG. 5, in an embodiment, the upper electrode 168 includes a first layer 168*a* doped with an impurity element and a second layer 168*b* disposed on the first layer 168*a*. The barrier layer 176 of the contact structure MC contacts the second layer 168*b*. The first layer 168*a* is a compound semiconductor layer doped with an impurity element. In addition, the second layer 168*b* is a conductive layer disposed on the compound semiconductor layer of the first layer 168*a*. In this specification, the "first layer 168" and the "second layer 168" may be referred to as a "compound semiconductor layer" and a "conductive layer", respectively. According to an embodiment, the lower surface of the contact structure MC is coplanar with the upper surface of the second layer 168*b*. The contact structure MC contacts the second layer 168*b* and is spaced apart from the first layer 168*a*. On the upper surface of the lower electrode 170, the thickness of the first layer 168*a* is greater than the thickness of the second layer 168*b*. The second layer 168*b* includes a material that differs from a material of the first layer 168*a*. For example, the second layer 168*b* includes a metal, and the first layer 168*a* includes a doped compound semiconductor layer. According to an embodiment, the first layer 168*a* includes silicon germanium (SiGe) doped with a Group III element. For example, the first layer 168*a* includes boron (B), the semiconductor material includes silicon (Si), and a compound semiconductor layer doped with boron (B) such as SiGe:B is included therein. The second layer 168*b* includes, for example, at least one of titanium (Ti), titanium nitride (TiN), tantalum (Ta), tantalum nitride (TaN), titanium aluminum nitride (TiAlN), tungsten (W), tungsten nitride (WN), ruthenium (Ru), iridium (Jr), platinum (Pt), or combinations thereof. Resistance of the upper electrode 168 decreases due to the second layer 168*b*, and the performance of the semiconductor device is increased. According to an embodiment, the first layer 168*a* is doped with an impurity element to have a conductivity type.

Figure 6:
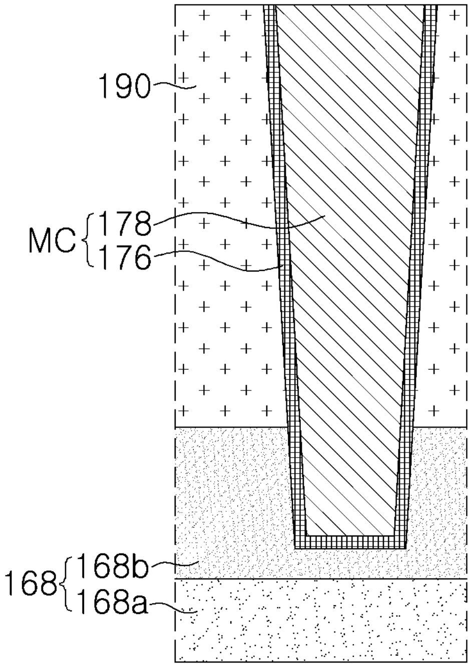
FIG. 6 is a partial enlarged cross-sectional view of a semiconductor device according to embodiments of the present disclosure.

Referring to FIG. 6, in an embodiment, the contact structure MC extends into the upper electrode 168. The barrier layer 176 of the contact structure MC contacts the second layer 168*b*. According to an embodiment, the lowermost surface of the contact structure MC is disposed within the second layer 168*b*. For example, the lowermost surface of the contact structure MC is disposed at a lower level than the upper surface of the second layer 168*b* and a higher level than the lower surface of the second layer 168*b*. The contact structure MC contacts the second layer 168*b* and is spaced apart from the first layer 168*a*. For example, the lower surface of the barrier layer 176 is disposed at a lower level than the upper surface of the second layer 168*b* and disposed at a higher level than the lower surface of the second layer 168*b*. As the contact area between the contact structure MC and the second layer 168*b* increases, the resistance of the contact structure MC is reduced and the performance of the semiconductor device is increased.

Figure 7:
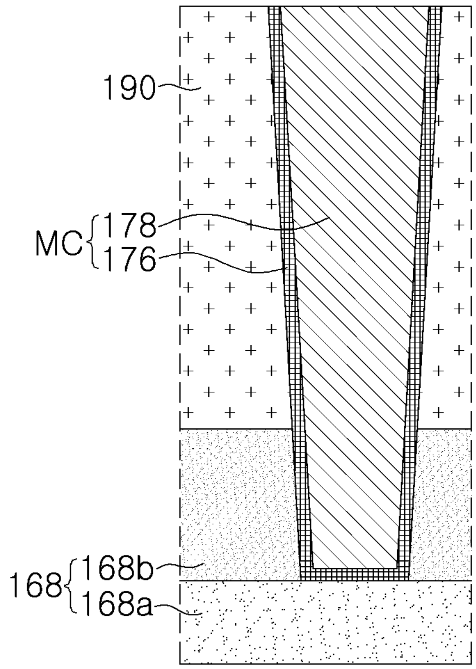
FIG. 7 is a partial enlarged cross-sectional view of a semiconductor device according to embodiments of the present disclosure.

Referring to FIG. 7, in an embodiment, the contact structure MC extends into the upper electrode 168, and the barrier layer 176 of the contact structure MC contacts the second layer 168*b*. According to an embodiment, the lowermost surface of the contact structure MC is substantially coplanar with the upper surface of the first layer 168*a* and the lowermost surface of the second layer 168*b*, but embodiments of the present disclosure are not necessarily limited thereto. In an embodiment, the contact structure MC passes through the second layer 168*b* and contact the first layer 168*a*.

Figure 8:
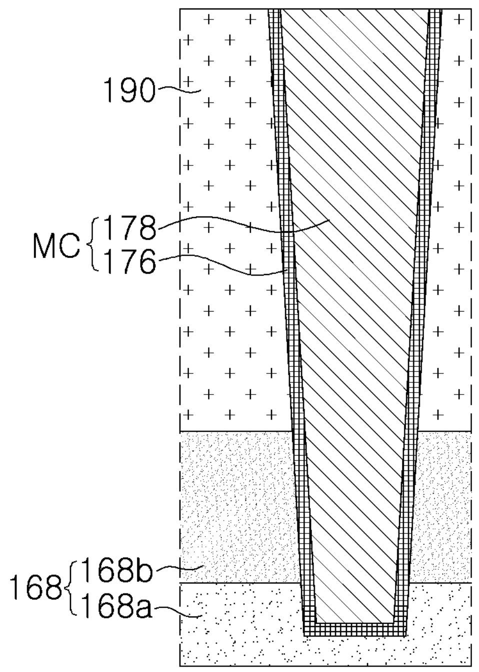
FIG. 8 is a partially enlarged cross-sectional view of a semiconductor device according to embodiments of the present disclosure.

Referring to FIG. 8, in an embodiment, the contact structure MC extends into the upper electrode 168, and the lowermost surface of the contact structure MC is disposed at a lower level than the upper surface of the first layer 168*a*. According to an embodiment, the contact structure MC contacts the first layer 168*a*. The contact structure MC passes through the second layer 168*b* and extends into the first layer 168*a*.

Figure 9:
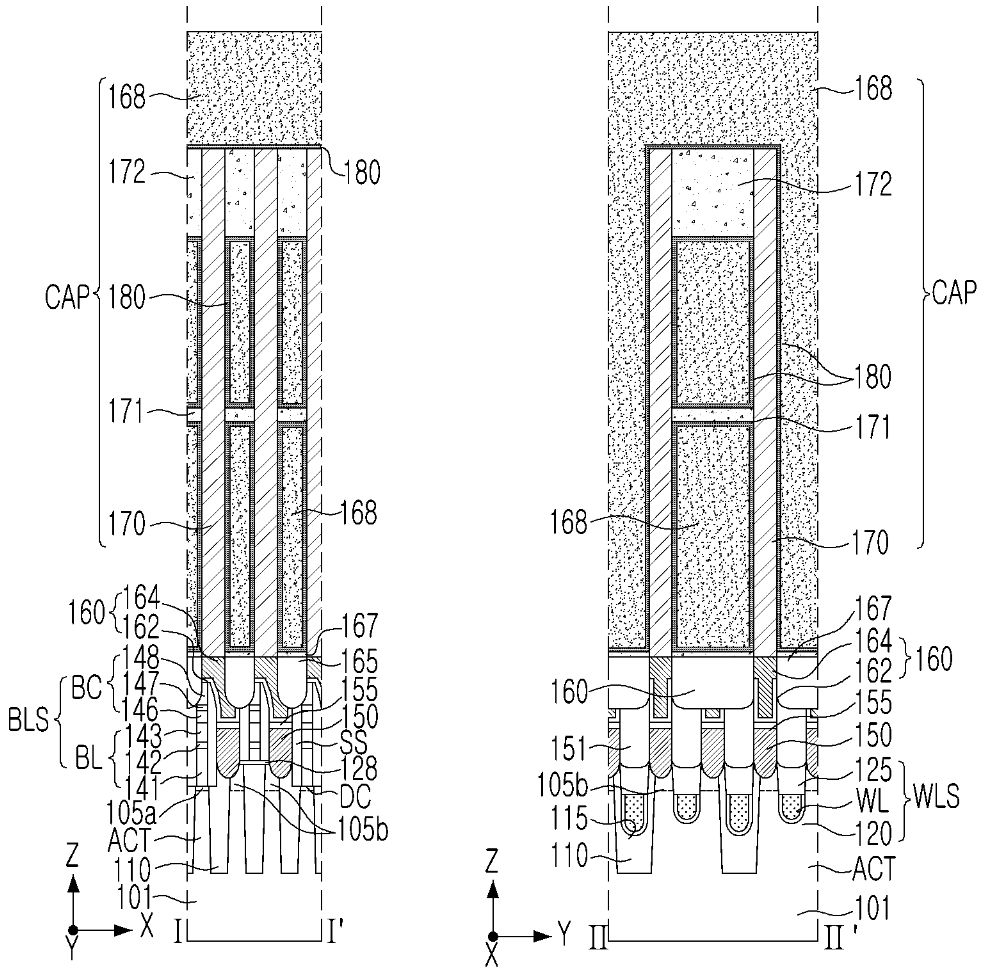
FIGS. 9 to 11 illustrate a method of manufacturing a semiconductor device according to embodiments of the present disclosure.
Figure 10:
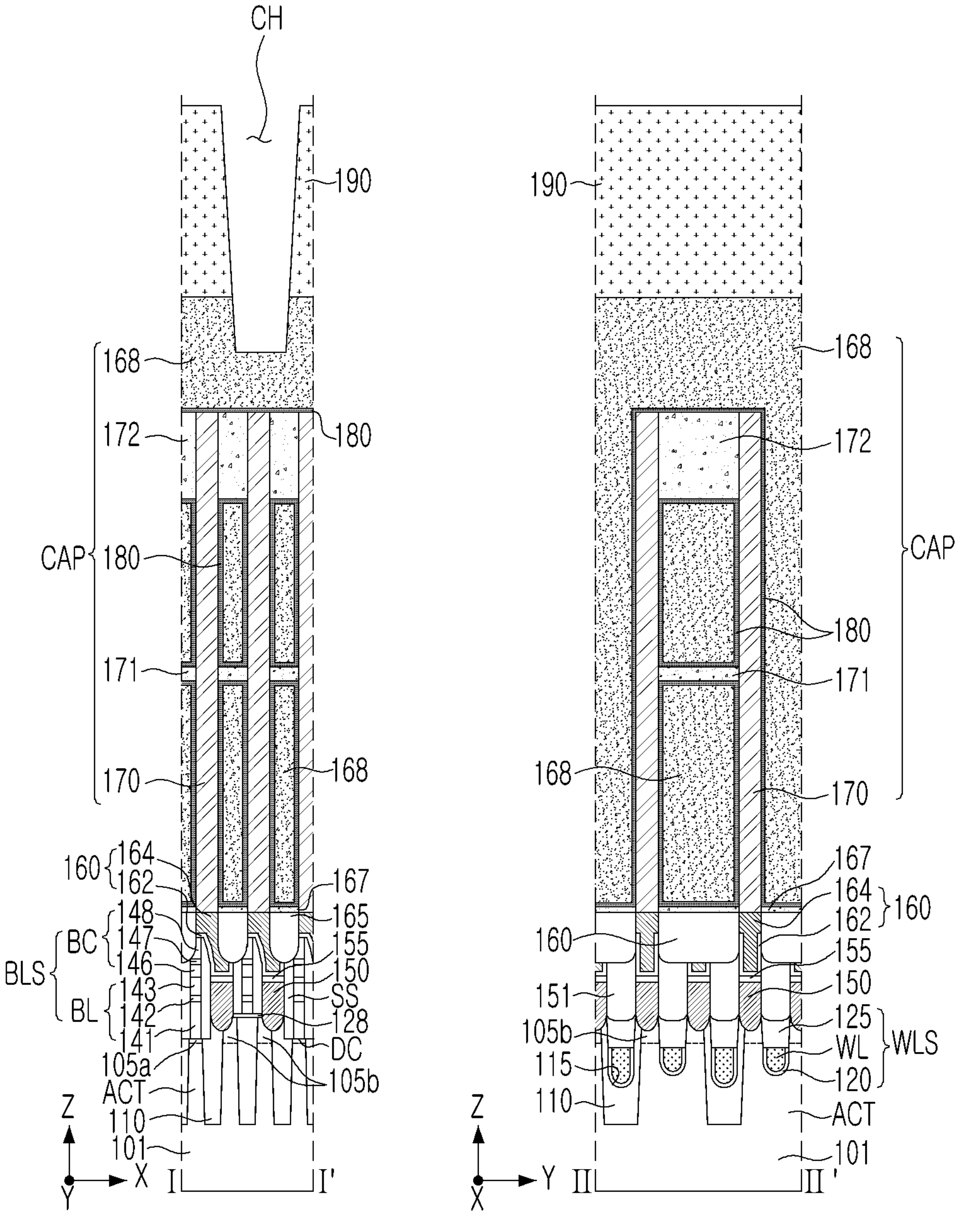
Figure 11:
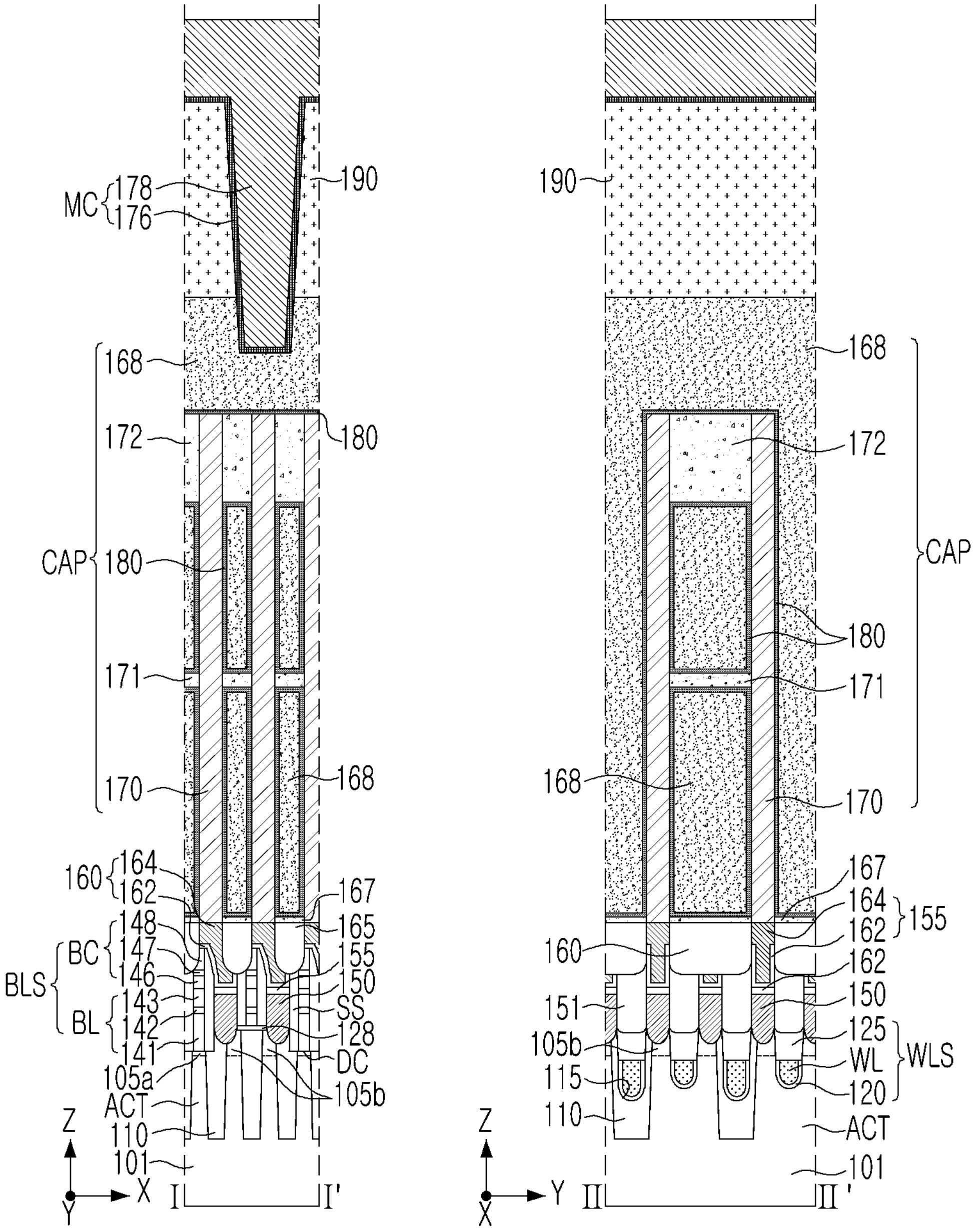

FIGS. 9 to 11 illustrate a method of manufacturing a semiconductor device according to embodiments of the present disclosure. FIGS. 9 to 11 illustrate a process of forming a capacitor structure CAP and a contact structure MS of FIG. 3.

Referring to FIG. 9, in an embodiment, a lower structure is formed on the substrate 101. A capacitor structure CAP is formed on the lower structure.

Forming the lower structure includes forming the device isolation layer 110 and the active region ACT on the substrate 101, forming impurity regions 105*a* and 105*b*, forming the word line structure WLS after forming the gate trench 115, forming a bit line structure (BLS) on the substrate 101, forming a spacer structure (SS) on the side of the bit line structure (BLS), forming fence insulation patterns 151 between the spacer structures SS, forming an upper conductive pattern 160 between the fence insulation patterns 151, forming insulating patterns 165 that penetrate a portion of the upper conductive pattern 160, and forming an etch stop layer 167 on the insulating patterns 165 and the upper conductive pattern 160.

Forming the capacitor structure (CAP) on the lower structure includes forming lower electrodes 170, forming supporter layers 171 and 172 that support the lower electrodes 170, forming a dielectric layer 180 on the lower electrodes 170, and forming an upper electrode 168 on the dielectric layer 180. Forming the lower electrodes 170 includes forming mold layers on the etch stop layer 167, forming a plurality of holes that penetrate the mold layers and the etch stop layer 167, and forming a conductive material in the plurality of holes.

The upper electrode 168 may be formed by, for example, a chemical vapor deposition (CVD) process, etc. According to an embodiment, a silane-based compound such as monosilane ($SiH_4$) or disilane ($Si_2H_6$) can be used as the silicon (Si) source gas, but embodiments of the present disclosure are not necessarily limited thereto. A germanium (Ge) source gas may be, for example, one of mono-germane ($GeH_4$) or di-germane ($Ge_2H_6$), etc., but embodiments are not necessarily limited thereto. The boron (B) dopant gas may be, for example, one of boron trichloride ($BCl_3$) or $B_2H_6$, etc., but embodiments are not necessarily limited thereto, and as the boron (B) dopant gas may be one of $B_4H_{10}$, $B_5H_9$, $B_5H_{11}$, $B_6H_{10}$, or $B_{10}H_{14}$, etc.

When forming the upper electrode 168, the flow rates of the silicon (Si) source gas, the germanium (Ge) source gas, and the boron (B) dopant gas can be appropriately mixed. Therefore, the concentration of silicon (Si) is in the range of about 10 at % to about 15 at %, and the concentration of boron (B) is in the range of about 0.1 at % to about 5 at %. For example, the concentration of silicon (Si) is in the range of about 10 at % to about 13 at %, and for example, the concentration of the first element is in the range of about 10.4 at % to about 12.5 at %, and the concentration of boron (B) is in the range of about 1 at % to about 4 at %. For example, the concentration of the impurity element is in the range of about 1.5 at % to about 3.6 at %. According to an embodiment, the concentration of silicon (Si) was measured to be about 11.4 at %, and the concentration of boron (B) was measured to be about 2.3 at %. By adjusting the concentration of boron (B) as described above, neutrons generated due to radiation exposure during the transportation of the semiconductor device 100 can prevented from boron (B)-10 fission, etc., and by adjusting the concentration of silicon (Si), the resistance to the etching process in the FAB process (FABrication) can be increased. Therefore, defects of the semiconductor device 100 generated during the transportation of the semiconductor device 100 can be prevented.

Referring to FIG. 10, in an embodiment, an upper insulating layer 190 and a contact hole CH are sequentially formed.

The upper insulating layer 190 is formed, a separate mask layer is formed on the upper insulating layer 190, and a photo process and an etching process are performed, thereby forming the contact hole CH. The contact hole CH passes through portions of the upper insulating layer 190 and the upper electrode 168 and exposes a portion of the upper electrode 168.

Referring to FIG. 11, in an embodiment, a barrier layer 176 and a conductive layer 178 on the barrier layer 176 are sequentially formed in the contact hole CH.

The barrier layer 176 covers the inner side and lower surfaces of the contact hole CH and the upper surface of the upper insulating layer 190 with a uniform thickness. The conductive layer 178 covers the barrier layer 176 and fills the contact hole CH.

Referring together with FIG. 3, a planarization process is performed that partially removes the barrier layer 176 and the conductive layer 178. As a result, the contact structure MC that includes the barrier layer 176 and the conductive layer 178 is formed in the contact hole CH. The contact structure MC has a pillar structure. In this manner, the semiconductor device 100 of FIG. 3 is manufactured.

Figure 12:
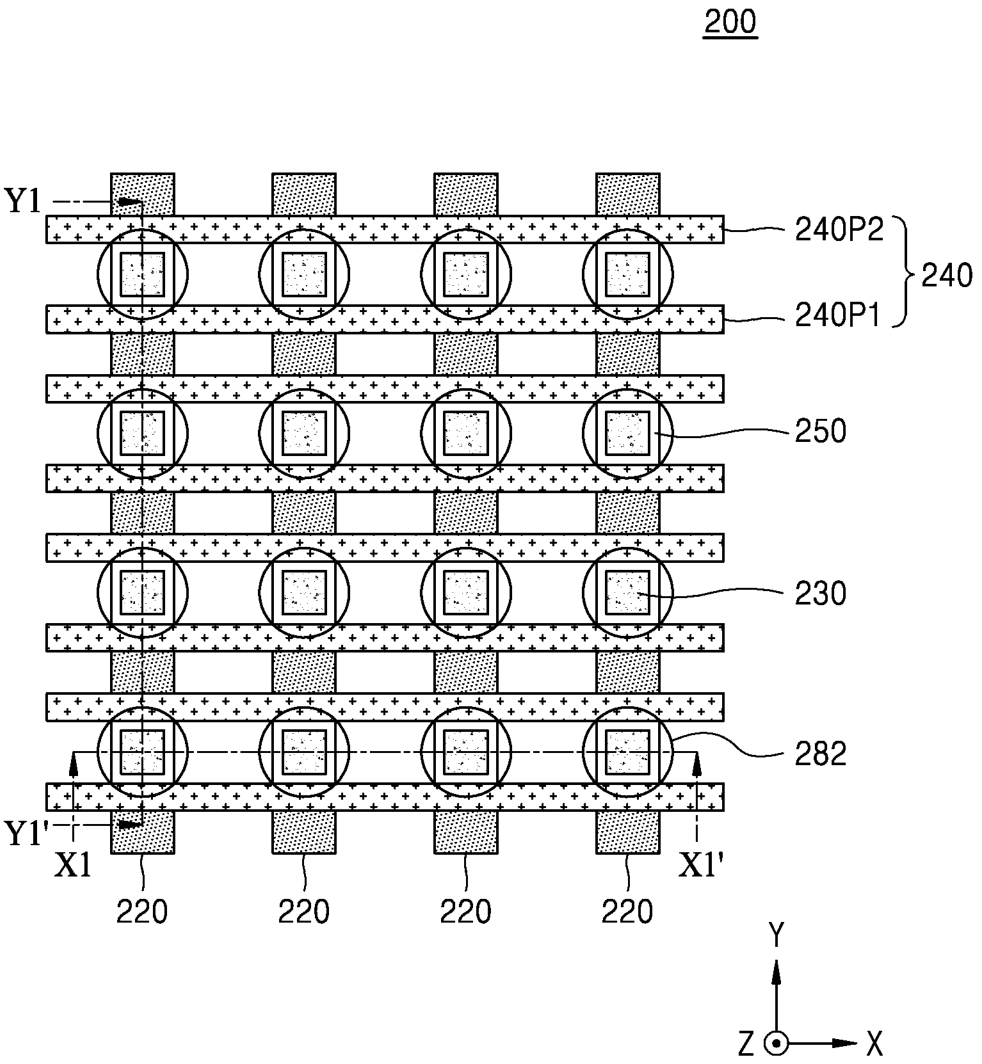
FIG. 12 is a layout diagram of an integrated circuit device according to embodiments of the present disclosure.

FIG. 12 is a layout diagram of an integrated circuit device according to embodiments of the present disclosure.

Figure 13:
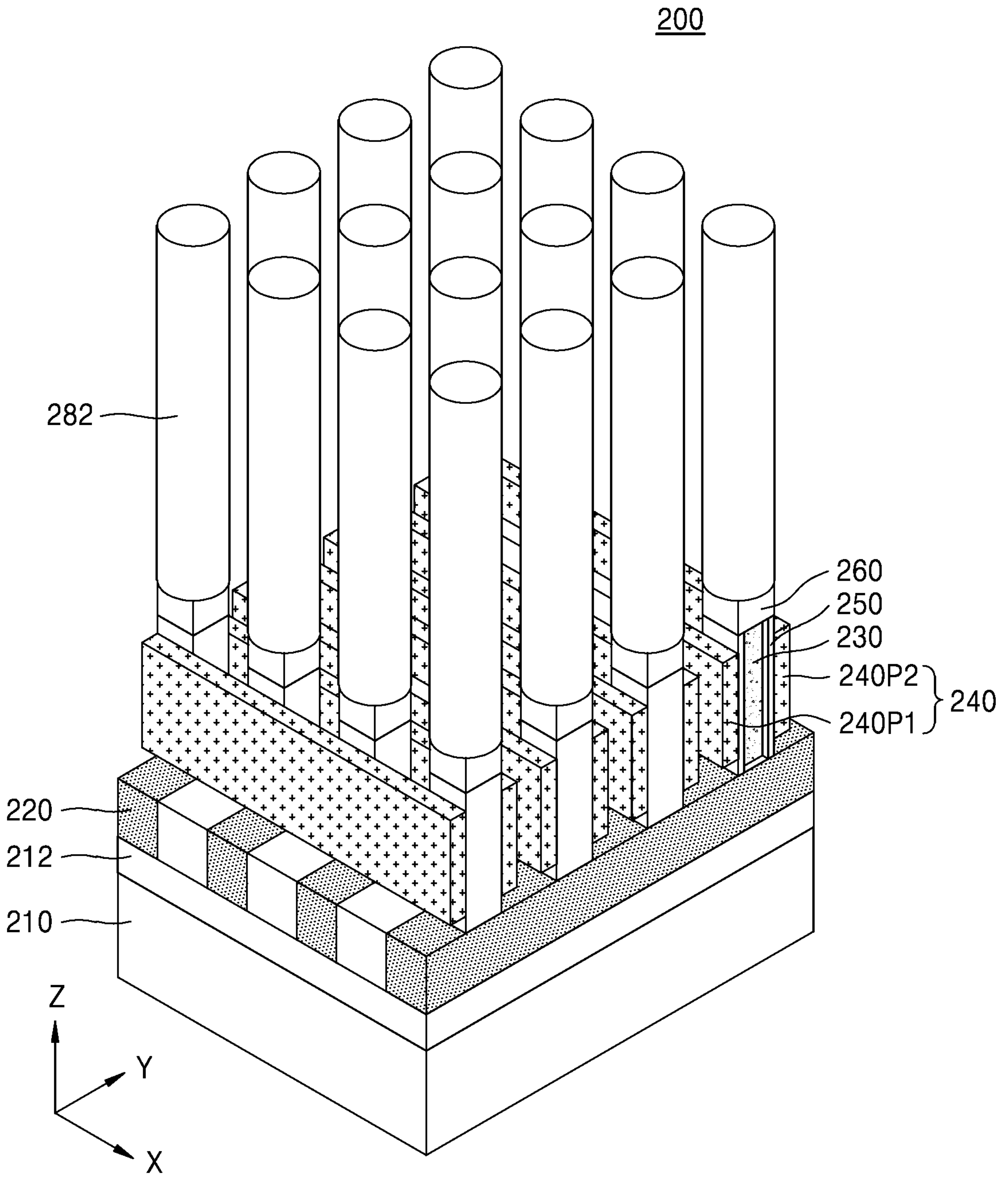
FIG. 13 is a perspective view of an integrated circuit device according to embodiments of the present disclosure.

FIG. 13 is a perspective view of an integrated circuit device according to embodiments of the present disclosure.

Figure 14:
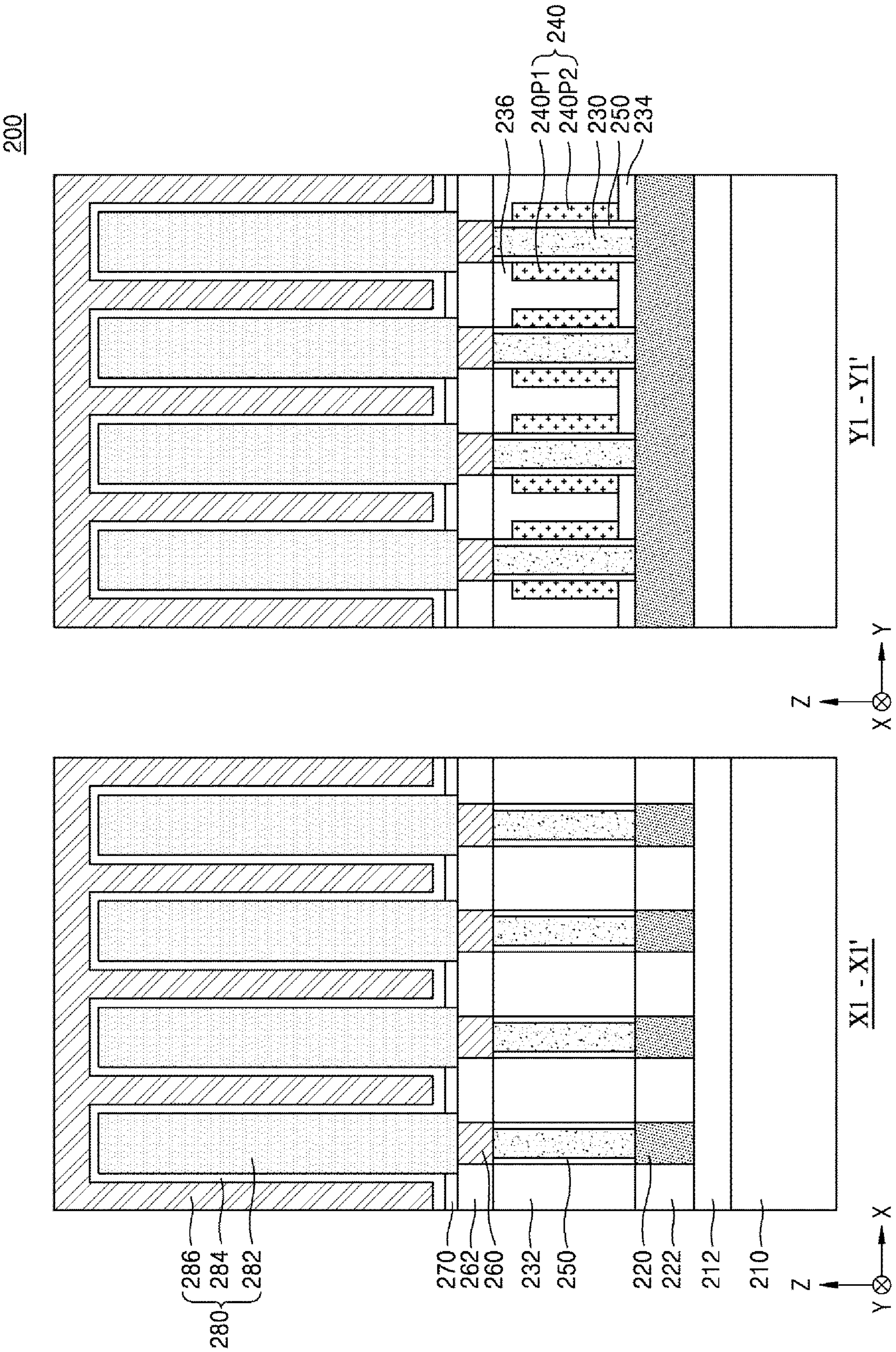
FIG. 14 is a cross-sectional view of an integrated circuit device according to embodiments of the present disclosure.

FIG. 14 is a cross-sectional view of an integrated circuit device according to embodiments of the present disclosure.

FIG. 14 is a cross-sectional view taken along the cutting line X1-X1' and Y1-Y1' of FIG. 12.

Referring to FIGS. 12 to 14, an integrated circuit device 200 includes a substrate 210, a plurality of first conductive lines 220, a channel layer 230, a gate electrode 240, a gate insulating layer 250, and a data storage structure 280. The integrated circuit device 200 is a memory device that includes a vertical channel transistor VCT. The vertical channel transistor refers to a structure in which the channel length of the channel layer 230 extends from the substrate 210 in a vertical direction.

A lower insulating layer 212 is disposed on the substrate 210, and the plurality of first conductive lines 220 are disposed on the lower insulating layer 212, are spaced apart from each other in a first direction (X direction) and extend in a second direction (Y direction). A plurality of first insulating patterns 222 are disposed on the lower insulating layer 212 and fill spaces between the plurality of first conductive lines 220. The plurality of first insulating patterns 222 extend in the second direction (Y direction), and upper surfaces of the plurality of first insulating patterns 222 are coplanar with upper surfaces of the plurality of first conductive lines 220. The plurality of first conductive lines 220 function as bit lines of the integrated circuit device 200.

In embodiments, the plurality of first conductive lines 220 include at least one of doped polysilicon, metal, conductive metal nitride, conductive metal silicide, conductive metal oxide, or combinations thereof. For example, the plurality of first conductive lines 220 are formed of at least one of doped Polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but embodiments of the present disclosure are not necessarily limited thereto. The plurality of first conductive lines 220 may include a single layer or multiple layers of the aforementioned materials. In embodiments, the plurality of first conductive lines 220 include a 2D semiconductor material, and, for example, the two-dimensional semiconductor material includes at least one of graphene, carbon nanotubes, or combinations thereof.

The channel layer 230 includes a plurality of channel layers that are arranged in a matrix form spaced apart from each other in a first direction (X direction) and a second direction (Y direction) on the plurality of first conductive lines 220. Each channel layer 230 has a first width in a first direction (X direction) and a first height in a third direction (Z direction), and the first height is greater than the first width. For example, the first height is about 2 to 10 times the first width, but is not necessarily limited thereto. The bottom portion of the channel layer 230 functions as a first source/drain region, an upper portion of the channel layer 230 functions as a second source/drain region, and a middle portion of the channel layer 230 between the first and second source/drain regions functions as a channel region. The first source/drain region and the second source/drain region are vertically spaced apart from each other, and the channel region is a vertical channel region.

In embodiments, the channel layer 230 includes an oxide semiconductor, and, for example, the oxide semiconductor includes at least one of $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or combinations thereof. The channel layer 230 may include a single layer or multiple layers of the oxide semiconductor. In some embodiments, the channel layer 230 has a bandgap energy greater than a bandgap energy of silicon. For example, the channel layer 230 has a bandgap energy of about 1.5 eV to about 5.6 eV. For example, the channel layer 230 has optimal channel performance when it has a bandgap energy of about 2.0 eV to about 4.0 eV. For example, the channel layer 230 may be polycrystalline or amorphous, but is not necessarily limited thereto. In embodiments, the channel layer 230 includes a 2D semiconductor material, and, for example, the two-dimensional semiconductor material includes at least one of graphene, carbon nanotubes, or combinations thereof.

The gate electrode 240 extends in a first direction (X direction) on both sidewalls of the channel layer 230. The gate electrode 240 includes a first sub-gate electrode 240P1 that faces the first sidewall of the channel layer 230, and a second sub-gate electrode 240P2 that faces the second sidewall opposite to the first sidewall of the channel layer 230. As one channel layer 230 is disposed between the first sub-gate electrode 240P1 and the second sub-gate electrode 240P2, the integrated circuit device 200 has a dual-gate transistor structure. However, the technical idea of the present disclosure is not limited thereto, and a single gate transistor structure can be implemented by omitting the second sub-gate electrode 240P2 and forming only the first sub-gate electrode 240P1 that faces the first sidewall of the channel layer 230.

The gate electrode 240 includes at least one of doped polysilicon, a metal, a conductive metal nitride, a conductive metal silicide, a conductive metal oxide, or combinations thereof. For example, the gate electrode 240 is formed of at least one of doped Polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof, but is not necessarily limited thereto.

The gate insulating layer 250 surrounds sidewalls of the channel layer 230 and is interposed between the channel layer 230 and the gate electrode 240. For example, as illustrated in FIG. 14, the entire sidewall of the channel layer 230 is surrounded by the gate insulating layer 250, and a portion of the sidewall of the gate electrode 240 contacts the gate insulating layer 250. In other embodiments, the gate insulating layer 250 extends in the extension direction of the gate electrode 240, such as the first direction (X direction), and of the sidewalls of the channel layer 230, only two sidewalls that face the gate electrode 240 may contact the gate insulating layer 250.

In embodiments, the gate insulating layer 250 is formed of at least one of a silicon oxide layer, a silicon oxynitride layer, a high dielectric layer that has a higher dielectric constant than the silicon oxide layer, or combinations thereof. The high dielectric layer is formed of a metal oxide or a metal oxynitride. For example, a high dielectric layer usable as the gate insulating layer 250 is formed of at least one of $HfO_2$, HfSiO, HfSiON, HfTaO, HfSiO, HfZrO, $ZrO_2$, $Al_2O_3$, or combinations thereof, but is not necessarily limited thereto.

A plurality of second insulating patterns 232 extend in the second direction (Y direction) on the plurality of first insulating patterns 222, and the channel layer 230 is disposed between two adjacent second insulating patterns 232. In addition, a first buried layer 234 and a second buried layer 236 are disposed between two adjacent second insulating patterns 232 in a space between two adjacent channel layers 230. The first buried layer 234 is disposed on the bottom portion of the space between two adjacent channel layers 230, and the second buried layer 236 is disposed on the first buried layer 234 and fills the remainder of the space between two adjacent channel layers 230. An upper surface of the second buried layer 236 is coplanar with the upper surface of the channel layer 230, and the second buried layer 236 covers the upper surface of the gate electrode 240. Alternatively, in some embodiments, the plurality of second insulating patterns 232 are formed of a material layer that is continuous with a plurality of first insulating patterns 222, or the second buried layer 236 is formed of a material layer that is continuous with the first buried layer 234.

A storage contact 260 is disposed on the channel layer 230. The storage contact 260 vertically overlaps the channel layer 230, and includes a plurality of storage contacts that are arranged in a matrix form spaced apart from each other in a first direction (X direction) and a second direction (Y direction). The storage contact 260 is formed of at least one of doped Polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof, but is not necessarily limited thereto. An upper insulating layer 262 surround sidewalls of the storage contact 260 on the plurality of second insulating patterns 232 and the second buried layer 236.

An etch stop layer 270 is disposed on the upper insulating layer 262, and a data storage structure 280 is disposed on the etch stop layer 270. The data storage structure 280 includes a lower electrode 282, a dielectric layer 284, and an upper electrode 286.

The lower electrode 282 passes through the etch stop layer 270 and is electrically connected to an upper surface of the storage contact 260. The lower electrode 282 has a pillar type that extends in the third direction (Z direction), but embodiments of the present disclosure are not necessarily limited thereto. In embodiments, the lower electrode 282 includes a plurality of lower electrodes that vertically overlap the storage contacts 260, and are arranged in a matrix form spaced apart from each other in a first direction (X direction) and a second direction (Y direction). Alternatively, in an embodiment, a landing pad is further disposed between the storage contacts 260 and the lower electrodes 282 such that the lower electrodes 282 are arranged in a hexagonal pattern.

In the integrated circuit device 200, the upper electrode 286 of the data storage structure 280 includes boron (B) and silicon (Si). Boron (B) is present in the range of about 0.1 at % to about 5 at %, and silicon (Si) is present in the range of about 10 at % to about 15 at %. The upper electrode 286 includes the first layer 168*a* that contains boron (B) and the second layer 168*b* disposed on the first layer 168*a*.

Figure 15:
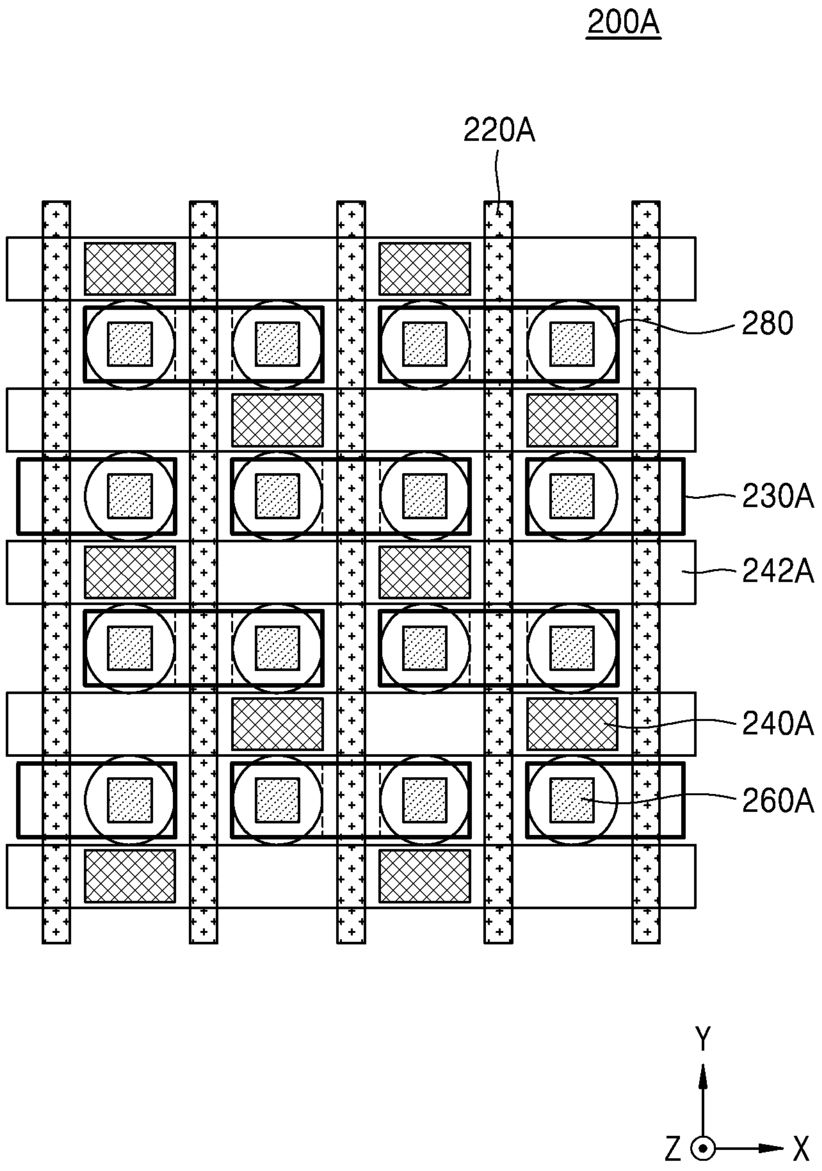
FIG. 15 is a layout diagram of an integrated circuit device according to embodiments of the present disclosure.

FIG. 15 is a layout diagram of an integrated circuit device according to embodiments of the present disclosure.

Figure 16:
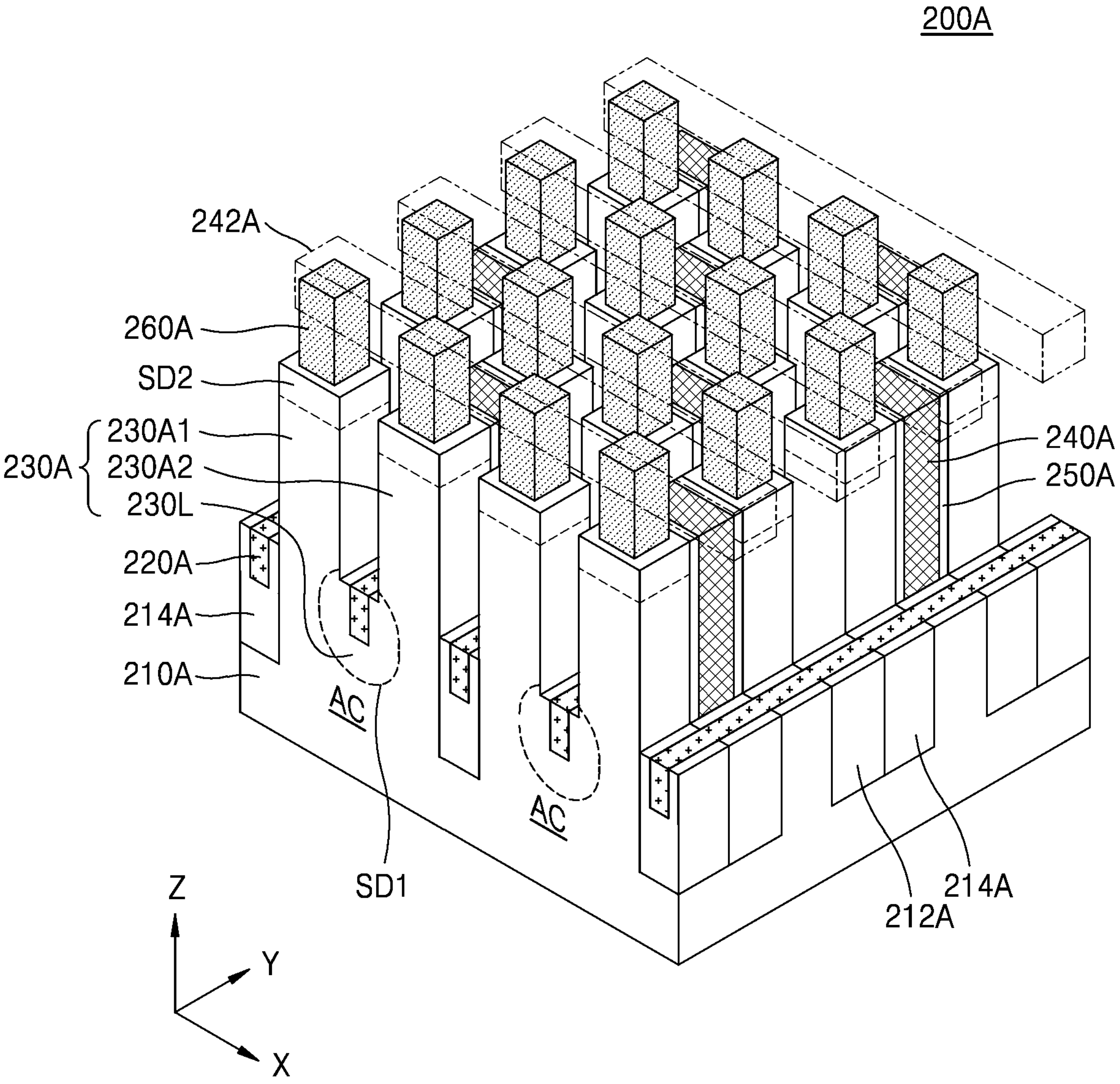
FIG. 16 is a perspective view of an integrated circuit device according to embodiments of the present disclosure.

FIG. 16 is a perspective view of an integrated circuit device according to embodiments of the present disclosure.

Referring to FIGS. 15 and 16, in an embodiment, an integrated circuit device 200A includes a substrate 210A, a plurality of first conductive lines 220A, a channel structure 230A, a contact gate electrode 240A, a plurality of second conductive lines 242A, and a data storage structure 280. The integrated circuit device 200A is a memory device that includes a vertical channel transistor VCT.

A plurality of active regions AC are defined by a first device isolation layer 212A and a second device isolation layer 214A formed in the substrate 210A. The channel structure 230A is disposed on each active region AC, and the channel structure 230A includes a first active pillar 230A1 and a second active pillar 230A2 that each extend in the vertical direction, and a connection portion 230L connected to the bottom portion of the first active pillar 230A1 and the bottom portion of the second active pillar 230A2. A first source/drain area SD1 is located in the connection part 230L, and a second source/drain area SD2 located on the first and second active pillars 230A1 and 230A2. The first active pillar 230A1 and the second active pillar 230A2 each include an independent unit memory cell.

The plurality of first conductive lines 220A extend in a direction that crosses the plurality of respective active regions AC, such as the second direction (Y direction). One of the plurality of first conductive lines 220A is disposed on the connection portion 230L between the first active pillar 230A1 and the second active pillar 230A2, and the one first conductive line 220A is disposed on the first source/drain area SD1. Another first conductive line 220A adjacent to the one first conductive line 220A is disposed between two channel structures 230A. One of the first conductive lines 220A functions as a common bit line for two unit memory cells constituted by the first active pillar 230A1 and the second active pillar 230A2 disposed on both sides of the one first conductive line 220A.

One contact gate electrode 240A is disposed between two channel structures 230A that are adjacent in the second direction (Y direction). For example, the contact gate electrode 240A is disposed between the first active pillar 230A1 of one channel structure 230A and the second active pillar 230A2 of the adjacent channel structure 230A, and one contact gate electrode 240A is shared by the first active pillar 230A1 and the second active pillar 230A2 on opposite sidewalls thereof. A gate insulating layer 250A is disposed between the contact gate electrode 240A and the first active pillar 230A1 and between the contact gate electrode 240A and the second active pillar 230A2. The plurality of second conductive lines 242A extend in the first direction (X direction) on the upper surface of the contact gate electrode 240A. The plurality of second conductive lines 242A function as word lines of the integrated circuit device 200A.

A storage contact 260A is disposed on the channel structure 230A. The storage contact 260A is disposed on the second source/drain area SD2, and the data storage structure 280 is disposed on the storage contact 260A.

In the integrated circuit device 200A, the upper electrode 286 of the data storage structure 280 includes boron (B) and silicon (Si). Boron (B) is present in the range of about 0.1 at % to about 5 at %, and silicon (Si) is present in the range of about 10 at % to about 15 at %. The upper electrode 286 includes the first layer 168*a* that contains boron (B) and the second layer 168*b* disposed on the first layer 168*a* (see FIG. 5).

Figure 17:
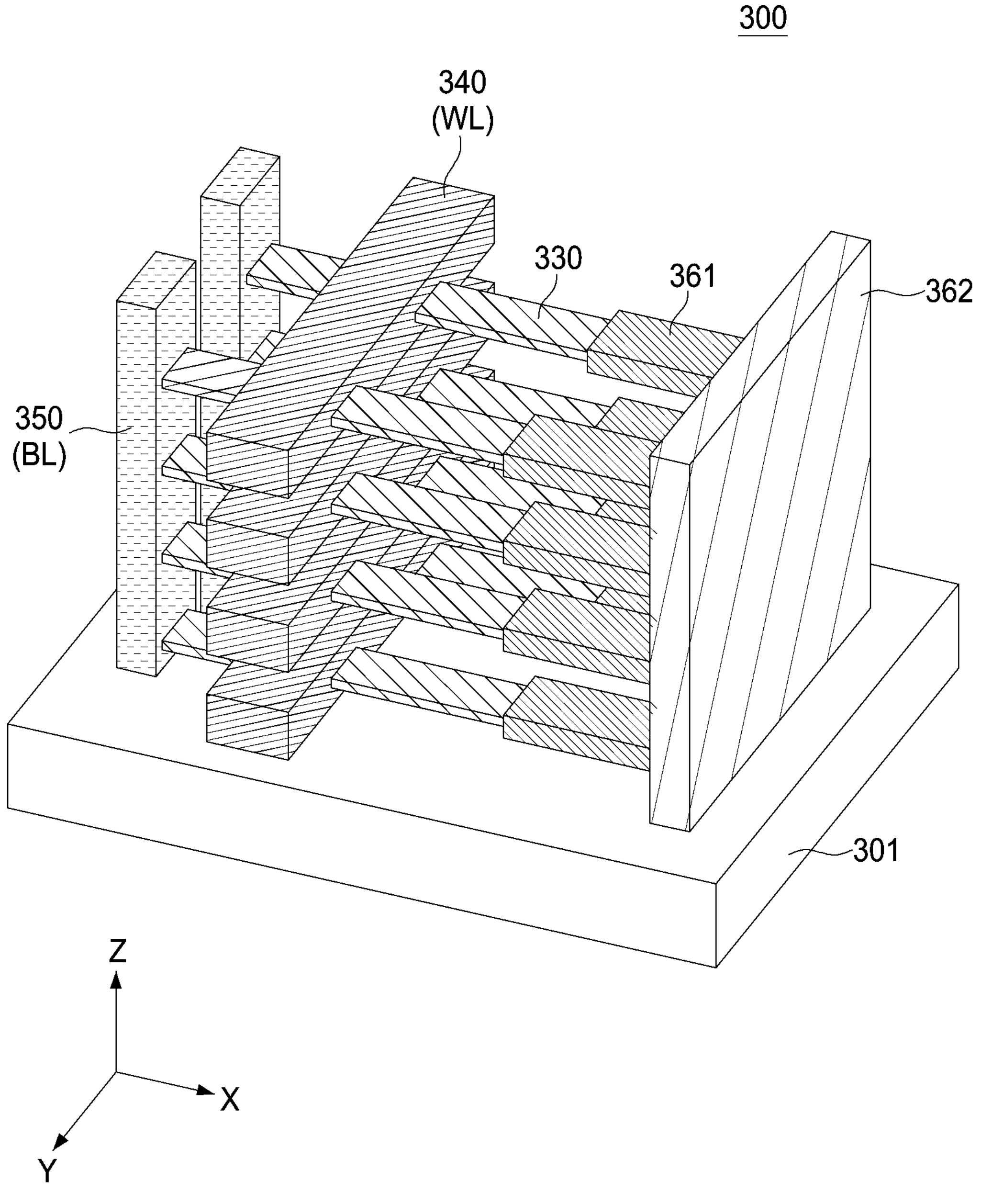
FIG. 17 is a perspective view of a semiconductor device according to embodiments of the present disclosure.

FIG. 17 is a perspective view of a semiconductor device according to embodiments of the present disclosure.

Figure 18:
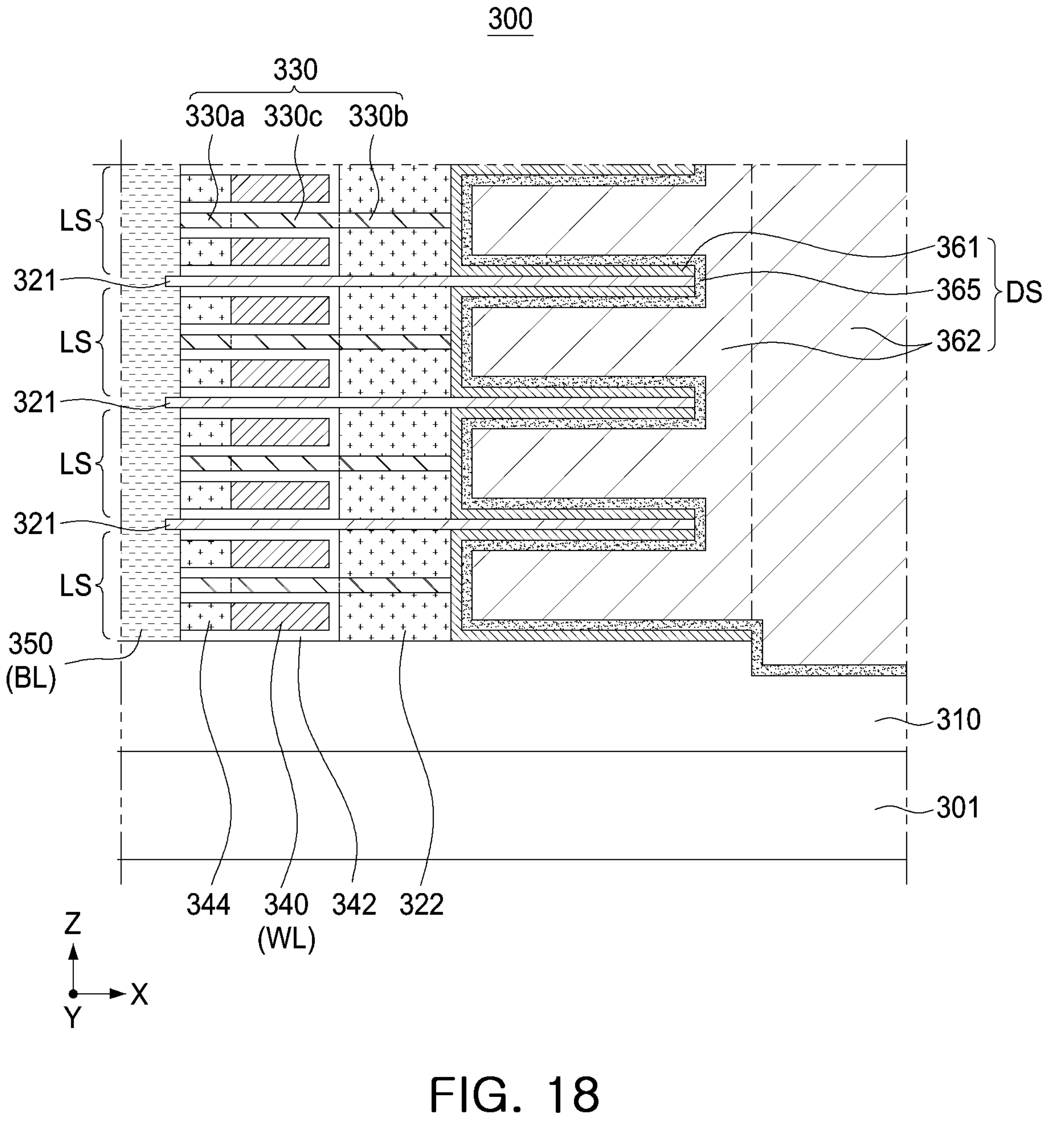
FIG. 18 is a cross-sectional view of a semiconductor device according to embodiments of the present disclosure.

FIG. 18 is a cross-sectional view of a semiconductor device according to embodiments of the present disclosure. FIG. 18 is a cross section of the semiconductor device in FIG. 17. FIG. 18 shows the structure of a pair of adjacent sub-cell arrays described with reference to FIG. 17.

Referring to FIGS. 17 and 18, in an embodiment, a semiconductor device 300 include a substrate 301, a lower structure 310 disposed on the substrate 301, a plurality of structures LS and a plurality of first insulating layers 321 that are alternately stacked on the substrate 301, and a plurality of second conductive patterns 350 disposed on the substrate 301 and that spaced apart from each other. Each of the plurality of structures LS includes an active layer 330 that extends in the X direction, a first conductive pattern 340 that crosses the active layer 330 and extends in a Y direction perpendicular to the X direction, a gate dielectric layer 342 disposed between the active layer 330 and the first conductive pattern 340, a gate capping layer 344 disposed between the first conductive pattern 340 and the second conductive pattern 350, a first electrode 361 of a data storage structure DS, and a second insulating layer 322 disposed between the first conductive pattern 340 and the first electrode 361. The data storage structure DS further includes a dielectric layer 365 disposed on the first electrode 361 and a second electrode 362 disposed on and around the dielectric layer 365. The X direction and the Y direction are perpendicular to each other and parallel to the upper surface of the substrate 301. The Z direction is perpendicular to the X and Y directions, and is perpendicular to the upper surface of the substrate 301.

The lower structure 310 is disposed on the substrate 301. The plurality of structures LS and the plurality of first insulating layers 321 are stacked on the lower structure 310. The lower structure 310 includes a device region on the substrate 301 and an insulating region that covers the device region. The insulating region is formed of insulating layers that include an insulating material, such as at least one of silicon oxide, silicon nitride, silicon oxynitride, or silicon oxycarbide.

The plurality of structures LS and the plurality of first insulating layers 321 form a stack structure on the substrate 301. The plurality of structures LS are interposed between the plurality of first insulating layers 321, and are spaced apart from each other by the plurality of first insulating layers 321 in the Z direction. The first insulating layer 321 extend in the X direction, and an end portion thereof extends into the second conductive pattern 350. The second insulating layer 322 is interposed between the first insulating layer 321 and the active layer 330 and between the first conductive pattern 340 and the data storage structure DS. The first insulating layer 321 and the second insulating layer 322 each include an insulating material, such as at least one of silicon oxide, silicon nitride, silicon oxynitride, or silicon oxycarbide. The first insulating layer 321 horizontally extends longer than the second insulating layer 322. The thickness of the second insulating layer 322 is greater than the thickness of the first insulating layer 321.

The active layer 330 is disposed on the substrate 301 and extends horizontally in the X direction. The active layer 330 includes a plurality of active layers that are spaced apart from each other in the Z direction, and are arranged in the Y direction. The plurality of active layers 330 arranged in the Z direction are disposed between the plurality of first insulating layers 321. The active layer 330 has one of a line shape, a bar shape, or a column shape that extends in the X direction while intersecting the first conductive pattern 340. The active layer 330 includes a semiconductor material, such as one of silicon, germanium, or silicon-germanium.

The active layer 330 includes a first impurity region 330*a*, a second impurity region 330*b*, and a channel region 330*c*. The first impurity region 330*a* is electrically connected to the second conductive pattern 350. The second impurity region 330*b* is electrically connected to the first electrode 361 of the data storage structure DS. The second impurity region 330*b* in the X direction is longer than the first impurity region 330*a* in the X direction, but embodiments of the present disclosure are not necessarily limited thereto. The channel region 330*c* is disposed between the first impurity region 330*a* and the second impurity region 330*b*. The channel region 330*c* overlaps the first conductive pattern 340. The first impurity region 330*a* and the second impurity region 330*b* are spaced apart from each other in the horizontal direction by the channel region 330*c* and are disposed on the same level, and the channel region 330*c* is a horizontal channel region 330*c*.

The first impurity region 330*a* and the second impurity region 330*b* are formed by doping or ion-implanting impurities into the active layer 330. The first impurity region 330*a* and the second impurity region 330*b* each have one of n-type or p-type conductivity.

The active layers 330 contain an oxide semiconductor, such as at least one of hafnium-silicon oxide (HSO), hafnium-zinc oxide (HZO), indium-zinc oxide (IZO), indium-gallium oxide (IGO), indium-tin oxide (ITO), indium-gallium-zinc oxide (IGZO), or indium-tin-zinc oxide (ITZO).

In another example, active layers 330 include a two-dimensional (2D) material in which atoms form a predetermined crystalline structure and form a channel of a transistor. The 2D material layer includes at least one of a transition metal dichalcogenide material layer (TMD material layer), a black phosphorous material layer, or a hexagonal boron-nitride material layer (hBN material layer). For example, the two-dimensional material layer includes at least one of BiOSe, Crl, $wSe_2$, $MoS_2$, TaS, WS, SnSe, ReS, β-SnTe, MnO, AsS, P(black), InSe, h-BN, GaSe, GaN, SrTiO, mXene, or Janus 2D materials, which form a two-dimensional material.

In another example, the structure LS further includes epitaxial layers grown from the active layer 330 and connected to the first region 330*a* and the second region 330*b* of the active layer 130.

The first conductive pattern 340 is disposed on the substrate 301 and extends horizontally in the Y direction. A plurality of the first conductive patterns 340 are spaced apart from each other in the Z direction and arranged in the X direction. The first conductive pattern 340 are disposed between the channel region 330*c* of the active layer 330 and the first insulating layer 321. The first conductive pattern 340 is disposed on an upper surface and a lower surface of the active layer 330. The first conductive pattern 340 crosses the second conductive pattern 350 and has one of a line shape, bar shape, or column shape that extends in the Y direction. In addition, the plurality of first conductive patterns 340 that are stacked in the Z direction within one memory cell have different lengths in the Y direction and provide a contact region in which respective upper surfaces are exposed.

The first conductive pattern 340 includes a conductive material, and the conductive material includes at least one of a doped semiconductor material, a conductive metal nitride, a metal, or a metal-semiconductor compound. The first conductive pattern 340 is the word line WL described with reference to FIG. 17, or may be referred to as a "gate electrode".

The gate dielectric layer 342 is disposed between the first conductive pattern 340 and the active layer 330. The gate dielectric layer 342 is formed between adjacent first insulating layers 321 and has a substantially conformal thickness in an inner space of a gap region formed by etching the second insulating layer 322 from the side surface. The gate dielectric layer 342 includes one of silicon oxide, silicon nitride, or a high-k material.

The gate capping layer 344 fills a region where the first conductive pattern 340 is partially removed from the side surface. For example, a side surface of the gate capping layer 344 contacts a side surface of the first conductive pattern 340, and upper and lower surfaces of the gate capping layer 344 are covered by the gate dielectric layer 342. The gate capping layer 344 electrically insulates the first conductive pattern 340 and the second conductive pattern 350.

The second conductive pattern 350 extends vertically on the substrate 301 in the Z direction. A plurality of the second conductive patterns 350 are arranged in the Y direction. The second conductive pattern 350 is disposed adjacent to the first impurity region 330*a* and the first end surface of the active layer 330. A plurality of active layers 330 stacked in the Z direction are electrically connected to one second conductive pattern 350. The second conductive pattern 350 has one of a line shape, a bar shape, or a pillar shape that extends in the Z direction. In addition, the semiconductor device may further include an upper wiring disposed on the second conductive pattern 350 and that is connected to the second conductive pattern 350 and extends in the X direction. The second conductive pattern 350 includes at least one of a doped semiconductor material, a conductive metal nitride, a metal, or a metal-semiconductor compound.

The data storage structure DS is disposed adjacent to the second impurity region 330*b* and the second end surface of the active layer 330. The data storage structure DS is electrically connected to the active layer 330. The data storage structure DS includes the first electrode 361, the dielectric layer 365 disposed on the first electrode 361, and the second electrode 362 disposed on the dielectric layer 365. As illustrated in FIG. 18, the first electrode 361 of the data storage structure DS has a cylinder shape, but embodiments are not necessarily limited thereto, and the first electrode 361 has a pillar shape in other embodiments.

The first electrode 361 has a substantially conformal thickness in an inner space of a gap region formed by etching the second insulating layer 322 from the side surface. The first electrode 361 includes nodes for respective structures LS that are separated by removing a portion on the side surface of the first insulating layer 321 after depositing a conductive material. The first electrode 361 includes at least one of a doped semiconductor material, a conductive metal nitride, a metal, or a conductive metal oxide.

The dielectric layer 365 conformally covers the first electrode 361. The dielectric layer 365 includes a portion that covers a protruding portion of the first electrode 361 that protrudes toward the second electrode 362. The dielectric layer 365 includes one of a high-k material, silicon oxide, silicon nitride, silicon oxynitride, or combinations thereof. However, according to embodiments, the dielectric layer 365 includes at least one of an oxide, a nitride, a silicide, an oxynitride, or a silicide oxynitride that includes at least one of Hf, Al, Zr, or La.

The second electrode 362 covers the dielectric layer 365. The second electrode 362 fills an inner space of the first electrode 361. The second electrode 362 includes at least one of a doped semiconductor material, a conductive metal nitride, a metal, or a metal-semiconductor compound.

In the semiconductor device 300, the second electrode 362 of the data storage structure DS includes boron (B) and silicon (Si). Boron (B) is present in the range of about 0.1 at % to about 5 at %, and silicon (Si) is present in the range of about 10 at % to about 15 at %. The second electrode 362 includes a first layer 168*a* that contains boron (B) and a second layer 168*b* disposed on the first layer 168*a* (see FIG. 5).

As set forth above, a semiconductor device is provided in which defects of the semiconductor device due to radiation can be prevented and electrical characteristics and reliability can be increased by adjusting a composition ratio of the upper electrode.

While embodiments have been illustrated and described above, it will be apparent to those skilled in the art that modifications and variations can be made without departing from the scope of the present disclosure as defined by the appended claims.

What is claimed is:

1. A semiconductor device, comprising:
a switching element; and
a data storage structure electrically connected to the switching element,
wherein the data storage structure includes,
a plurality of first electrodes;
a second electrode; and
a dielectric layer disposed between the plurality of first electrodes and the second electrode,
wherein the second electrode includes a compound semiconductor layer doped with an impurity element,
wherein the compound semiconductor layer includes two or more elements and includes a semiconductor material doped with the impurity element,
wherein the two or more elements include a first element and a second element,
wherein the first element is silicon (Si), the second element is germanium (Ge), and the impurity element is boron (B), and
wherein a concentration of the impurity element in the compound semiconductor layer is in a range of about 0.1 at % to about 5 at %, and a concentration of the first element in the compound semiconductor layer is in a range of about 10 at % to about 15 at %.

2. The semiconductor device of claim 1, wherein the compound semiconductor layer doped with the impurity element has a P-type conductivity.

3. The semiconductor device of claim 1, wherein the second electrode further includes a conductive layer on the compound semiconductor layer.

4. The semiconductor device of claim 3, wherein the conductive layer includes a material that differs from a material of the compound semiconductor layer.

5. The semiconductor device of claim 3, wherein the conductive layer includes titanium (Ti).

6. The semiconductor device of claim 3, further comprising a contact structure in contact with the second electrode.

7. The semiconductor device of claim 6, wherein the contact structure includes a barrier layer and a conductive layer on the barrier layer.

8. The semiconductor device of claim 6, wherein the contact structure is in contact with the conductive layer and spaced apart from the compound semiconductor layer.

9. The semiconductor device of claim 6, wherein the contact structure penetrates through the conductive layer and contacts the compound semiconductor layer.

10. The semiconductor device of claim 6, wherein the contact structure penetrates through the conductive layer and extends into the compound semiconductor layer.

11. The semiconductor device of claim 1, further comprising a bit line,
wherein the switching element includes a gate electrode that extends in a direction that intersects the bit line, and
wherein the first electrodes are located at a level higher than that of the bit line and the gate electrode.

12. A semiconductor device, comprising:
a transistor that includes a first source/drain region and a second source/drain region that are spaced apart from each other, a channel region interposed between the first and second source/drain regions, a gate dielectric layer in contact with the channel region, and a gate electrode disposed on the gate dielectric layer;
a bit line electrically connected to the first source/drain region; and a data storage structure that is electrically connected to the second source/drain region, wherein the data storage structure includes, a first electrode electrically connected to the second source/drain region;

a second electrode; and a dielectric layer disposed between the first electrode and the second electrode, wherein the second electrode includes a compound semiconductor layer doped with boron (B) and a conductive layer disposed on the compound semiconductor layer, wherein the compound semiconductor layer includes two or more elements, wherein the two or more elements include silicon (Si) and germanium (Ge), and wherein a concentration of the boron (B) in the compound semiconductor layer is within a range of about 0.1 at % to about 5 at %, and a concentration of the silicon (Si) in the compound semiconductor layer is within a range of about 10 at % to about 15 at %.

13. The semiconductor device of claim 12, further comprising a contact structure in contact with the second electrode, wherein the contact structure is spaced apart from the compound semiconductor layer and contacts the conductive layer.

14. The semiconductor device of claim 12, wherein a thickness of the compound semiconductor layer on an upper surface of the first electrode is greater than a thickness of the conductive layer.

15. The semiconductor device of claim 12, wherein the first and second source/drain regions are vertically spaced apart from each other, and wherein the channel region is a vertical channel region.

16. The semiconductor device of claim 12, wherein the first and second source/drain regions are spaced apart from each other in a horizontal direction and are on the same level, and wherein the channel region is a horizontal channel region.

17. A semiconductor device, comprising:

a device isolation layer that defines active regions on a substrate;

gate electrodes that cross the active regions and extend into the device isolation layer;

first impurity regions and second impurity regions formed in the active regions on both sides of the gate electrodes;

bit lines disposed on the gate electrodes and electrically connected to the first impurity regions;

upper conductive patterns disposed on side surfaces of the bit lines and electrically connected to the second impurity regions;

first electrodes that vertically extend on the upper conductive patterns and are connected to the upper conductive patterns, wherein the first electrodes are horizontally spaced apart from each other;

at least one supporter layer disposed between horizontally adjacent first electrodes and in contact with the first electrodes;

a dielectric layer disposed on the first electrodes and the at least one supporter layer; and a second electrode disposed on the dielectric layer, wherein the second electrode includes a compound semiconductor layer doped with an impurity element and a conductive layer disposed on the compound semiconductor layer, wherein the compound semiconductor layer includes two or more elements and includes a semiconductor material doped with the impurity element, wherein the two or more elements include a first element and a second element, and wherein a concentration of the impurity element in the compound semiconductor layer is in a range of about 0.1 at % to about 5 at %, and a concentration of the first element in the compound semiconductor layer is in a range of about 10 at % to about 15 at %.

18. The semiconductor device of claim 17, wherein the compound semiconductor layer includes a compound semiconductor layer doped with the impurity element and that has a conductivity type, wherein the conductive layer includes titanium (Ti), the impurity element is boron (B), and the first element is silicon (Si).

19. The semiconductor device of claim 17, further comprising a contact structure in contact with the conductive layer.

* * * * *